United States Patent
Yoneda

(10) Patent No.: US 8,664,658 B2
(45) Date of Patent: Mar. 4, 2014

(54) SEMICONDUCTOR DEVICE

(75) Inventor: Seiichi Yoneda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 238 days.

(21) Appl. No.: 13/101,266

(22) Filed: May 5, 2011

(65) Prior Publication Data

US 2011/0278564 A1    Nov. 17, 2011

(30) Foreign Application Priority Data

May 14, 2010   (JP) ................................ 2010-111907

(51) Int. Cl.
*H01L 29/04*      (2006.01)

(52) U.S. Cl.
USPC ............... 257/57; 257/66; 257/67; 257/69; 257/369; 257/E29.273

(58) Field of Classification Search
USPC ............. 257/371, 393, 402, 57–59, 66–72, 257/368–369, E29.273
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,462,723 B1 | 10/2002 | Yamazaki et al. | |
| 6,563,174 B2 | 5/2003 | Kawasaki et al. | |
| 6,603,453 B2 | 8/2003 | Yamazaki et al. | |
| 6,727,522 B1 | 4/2004 | Kawasaki et al. | |
| 6,960,787 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,"; Appl. Phys. Lett. (Applied Physics Letters , Sep. 27, 2004, vol. 85, No. 13, pp. 2541-2543.

(Continued)

*Primary Examiner* — H. Jey Tsai
(74) *Attorney, Agent, or Firm* — Eric J. Robinson; Robinson Intellectual Property Law Office, P.C.

(57) ABSTRACT

An n-channel transistor or a p-channel transistor provided with a second gate electrode for controlling a threshold voltage in addition to a normal gate electrode is used for a complementary logic circuit. In addition, an insulated gate field-effect transistor with an extremely low off-state current is used as a switching element to control the potential of the second gate electrode. A channel formation region of the transistor which functions as a switching element includes a semiconductor material whose band gap is wider than that of a silicon semiconductor and whose intrinsic carrier density is lower than that of silicon.

18 Claims, 17 Drawing Sheets

(56) References Cited

U.S. PATENT DOCUMENTS

| | | |
|---|---|---|
| 7,247,882 B2 | 7/2007 | Yamazaki et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,355,445 B2 | 4/2008 | Kimura |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 8,455,868 B2 | 6/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0013018 A1* | 1/2010 | Jeon et al. ............... 257/368 |
| 2010/0065844 A1 | 3/2010 | Tokunaga |
| 2010/0079169 A1* | 4/2010 | Kim et al. ............... 326/120 |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0139762 A1* | 6/2010 | Ohmi et al. ............... 136/256 |
| 2010/0148825 A1* | 6/2010 | Park et al. ............... 326/121 |
| 2010/0163876 A1* | 7/2010 | Inoue et al. ............... 257/59 |
| 2011/0089417 A1 | 4/2011 | Yamazaki et al. |
| 2011/0101332 A1 | 5/2011 | Yamazaki et al. |
| 2011/0101334 A1 | 5/2011 | Yamazaki et al. |
| 2011/0101339 A1 | 5/2011 | Yamazaki et al. |
| 2011/0101351 A1 | 5/2011 | Yamazaki |
| 2011/0108706 A1 | 5/2011 | Koyama |
| 2011/0108836 A1 | 5/2011 | Koyama et al. |
| 2011/0110145 A1 | 5/2011 | Yamazaki et al. |
| 2011/0116310 A1 | 5/2011 | Yamazaki et al. |
| 2011/0121285 A1 | 5/2011 | Yamazaki et al. |
| 2011/0121286 A1 | 5/2011 | Yamazaki et al. |
| 2011/0122670 A1 | 5/2011 | Yamazaki et al. |
| 2011/0122673 A1 | 5/2011 | Kamata et al. |
| 2011/0128777 A1 | 6/2011 | Yamazaki et al. |
| 2011/0134683 A1 | 6/2011 | Yamazaki et al. |
| 2011/0147737 A1 | 6/2011 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432 pp. 488-492.

Park.J et al., "Improvements in the Device Characteristics of Amorphous Indium Gallium Zinc Oxide Thin-Film Transistors by Ar Plasma Treatment,", Appl. Phys. Lett(Applied Physics Letters), Jun. 26, 2007, vol. 90, No. 26, pp. 262106-1-262106-3.

Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Sympoisum Digest of Technical Papers, May 20, 2008, vol. 39, pp. 621-624.

Prins.M et al., "A Ferroelectric Transparent Thin-Film Transistor,", Appl. Phys. Lett. (Applied Physics Letters , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett(Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using Igzo Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T at al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for Amoled Back-plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Paper, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee at al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys.(Japanese Journal of Applied Physics , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett.(Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett(Applied Physics Letters , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m≤4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids),.1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters , Sep. 1, 2003, vol. 83, No. 9, pp. 1755-1757.

* cited by examiner

SEMICONDUCTOR DEVICE

BACKGROUND OF THE INVENTION

1. Field of the Invention

The present invention relates to a semiconductor device including a complementary logic circuit.

2. Description of the Related Art

In recent years, a metal oxide having semiconductor characteristics, which is called an oxide semiconductor, has attracted attention as a novel semiconductor material having high mobility as in the case of polysilicon or microcrystalline silicon and having uniform element characteristics as in the case of amorphous silicon. The metal oxide is used for various applications. For example, indium oxide is a well-known metal oxide and used as a material of a transparent electrode included in a liquid crystal display device or the like. Examples of the metal oxide having semiconductor characteristics include tungsten oxide, tin oxide, indium oxide, zinc oxide, and the like. Transistors in which a channel formation region is formed using such a metal oxide having semiconductor characteristics are already known (Patent Documents 1 and 2).

REFERENCE

[Patent Document 1] Japanese Published Patent Application No. 2007-123861
[Patent Document 2] Japanese Published Patent Application No. 2007-096055

SUMMARY OF THE INVENTION

A complementary logic circuit in which a p-channel transistor and an n-channel transistor are combined has an advantage that power consumption can be reduced as compared to power consumption of a logic circuit including a transistor of a single conductivity type because one of the transistors can be turned on and the other of the transistors can be turned off in the complementary logic circuit, which depends on the potential supplied to the respective gate electrodes of the transistors. However, when the potentials of the respective gate electrodes are switched from a high level to a low level or from a low level to a high level, both of the transistors are turned on and a current called a through current flows during a short period in some cases, which depends on the threshold voltages of the p-channel transistor and the n-channel transistor.

The power consumption due to the through current increases as the integration degree of an integrated circuit including a logic circuit is increased. For example, in the case of an integrated circuit provided with one billion complementary inverters each including a p-channel transistor and an n-channel transistor, it is calculated that a current as large as 1 mA is consumed in the integrated circuit in total when a through current of 1 pA flows through each inverter. Further, when the driving frequency of the integrated circuit is increased up to the unit of gigahertz (GHz), the amount of heat generation due to a through current becomes large.

In view of the above problems, it is an object of one embodiment of the present invention to propose a semiconductor device in which power consumption can be suppressed with a complementary logic circuit that can reduce a through current. Alternatively, it is another object of one embodiment of the present invention to propose a semiconductor device in which heat generation can be suppressed with a complementary logic circuit that can reduce a through current.

According to one embodiment of the present invention, an n-channel transistor or a p-channel transistor provided with a second gate electrode for controlling a threshold voltage in addition to a normal gate electrode is used for a complementary logic circuit. In addition, an insulated gate field-effect transistor (hereinafter simply referred to as a transistor) with an extremely low off-state current is used as a switching element to control the potential of the second gate electrode.

Specifically, the logic circuit has a structure in which at least one p-channel transistor and at least one n-channel transistor are connected to each other in series between a first node and a second node. The p-channel transistor or the n-channel transistor can be any transistor as long as it is an insulated gate field-effect transistor. Specifically, the p-channel transistor or the n-channel transistor includes a first gate electrode, a second gate electrode, a semiconductor film positioned between the first gate electrode and the second gate electrode, a first insulating film positioned between the first gate electrode and the semiconductor film, a second insulating film positioned between the second gate electrode and the semiconductor film, and a source electrode and a drain electrode in contact with the semiconductor film. The threshold voltage of the transistor having the second gate electrode is controlled by the height of the potential of the second gate electrode, more specifically by the potential difference between the source electrode and the second gate electrode.

Alternatively, according to one embodiment of the present invention, an n-channel transistor and a p-channel transistor are used for a complementary logic circuit, and the substrate potential of one of the transistors is controlled by a transistor with an extremely low off-state current, which functions as a switching element.

Specifically, the logic circuit has a structure in which at least one p-channel transistor and at least one n-channel transistor are connected to each other in series between a first node and a second node. The threshold voltage of the p-channel transistor or the n-channel transistor is controlled by the height of the substrate potential, more specifically by the potential difference between the potential of the source electrode and the substrate potential.

A channel formation region of the transistor which functions as a switching element includes a semiconductor material whose band gap is wider than that of a silicon semiconductor and whose intrinsic carrier density is lower than that of silicon. With the channel formation region including a semiconductor material having the above characteristics, a transistor with an extremely low off-state current can be realized. As examples of such a semiconductor material, an oxide semiconductor having a band gap which is approximately three times as wide as that of silicon can be given. By the transistor with an extremely low off-state current, the potential of the second gate electrode can be held even when a potential is not always supplied to the second gate electrode; therefore, the threshold voltage which is set in accordance with the potential can be maintained.

The oxide semiconductor is metal oxide having semiconductor characteristics, and has mobility almost as high as in the case of microcrystalline or polycrystalline silicon, and uniform element characteristics as in the case of amorphous silicon. In addition, an oxide semiconductor which is highly purified (a purified OS) by reduction of impurities such as moisture or hydrogen which serve as electron donors (donors) is an intrinsic semiconductor (an i-type semiconductor) or a substantially intrinsic semiconductor. Therefore, a transistor including the oxide semiconductor has a characteristic of an extremely low off-state current. Specifically, the concentration of hydrogen in the highly purified oxide semiconductor, which is measured by secondary ion mass spectrometry (SIMS), is $5\times10^{19}/cm^3$ or less, preferably $5\times10^{18}/cm^3$ or less, more preferably $5\times10^{17}/cm^3$ or less, or still more preferably less than $1\times10^{16}/cm^3$. In addition, the carrier density of the oxide semiconductor film, which is measured by Hall effect measurement, is lower than $1\times10^{14}/cm^3$, preferably lower than $1\times10^{12}/cm^3$, or more preferably lower than $1\times10^{11}/cm^3$. Furthermore, the band gap of the oxide semiconductor is 2 eV or more, preferably 2.5 eV or more, or more preferably 3 eV or more. By using a highly purified oxide semiconductor film with sufficiently reduced concentration of impurities such as moisture and hydrogen, the off-state current of the transistor can be reduced.

The analysis of the concentration of hydrogen in the oxide semiconductor film is described here. The concentration of hydrogen in the oxide semiconductor film is measured by SIMS. It is known to be difficult to obtain correct data in the proximity of a surface of a sample or in the proximity of an interface between stacked films formed using different materials by the SIMS in principle. Thus, in the case where distribution of the hydrogen concentration of the film in thickness direction is analyzed by SIMS, an average value in a region where the film is provided, the value is not greatly changed, and almost the same value can be obtained is employed as the hydrogen concentration. Further, in the case where the thickness of the film to be measured is small, a region where almost the same value can be obtained cannot be found in some cases due to the influence of the hydrogen concentration of the films adjacent to each other. In this case, the local maximum value or the local minimum value of the hydrogen concentration of a region where the film is provided is employed as the hydrogen concentration of the film. Furthermore, in the case where a mountain-shaped peak having the local maximum value and a valley-shaped peak having the local minimum value do not exist in the region where the film is provided, the value of the inflection point is employed as the hydrogen concentration.

Specifically, various experiments can actually prove a low off-state current of the transistor including the highly purified oxide semiconductor film as an active layer. For example, even with an element with a channel width of $1\times10^6$ μm and a channel length of 10 μm, in a range of from 1 V to 10 V of a voltage (drain voltage) between a source electrode and a drain electrode, it is possible that an off-state current (which is a drain current in the case where a voltage between a gate electrode and the source electrode is 0 V or less) is less than or equal to the measurement limit of a semiconductor parameter analyzer, that is, less than or equal to $1\times10^{-13}$ A. In this case, it can be seen that the off-state current density corresponding to a value obtained by dividing the off-state current by the channel width of the transistor is 100 zA/μm or lower. In addition, in an experiment, a circuit where a capacitor is connected to a transistor (the thickness of a gate insulating film is 100 nm) and charges flowing in or out of the capacitor are controlled by the transistor is used. When a highly purified oxide semiconductor film is used for a channel formation region of the transistor and the off-state current density of the transistor is measured from variation of charges of the capacitor per unit time, it is seen that 10 zA/μm to 100 zA/μm, which is much lower off-state current density, can be obtained in the case where the voltage between the source electrode and the drain electrode of the transistor is 3 V. Therefore, in the semiconductor device according to one embodiment of the present invention, the off-state current density of the transistor including the highly purified oxide semiconductor film as an active layer can be lower than or equal to 10 zA/μm, preferably lower than or equal to 1 zA/μm, or more preferably lower than or equal to 1 yA/μm, which depends on the voltage between the source electrode and drain electrode. Accordingly, the transistor including the highly purified oxide semiconductor film as an active layer has an extremely lower off-state current than a transistor including crystalline silicon.

Examples of the oxide semiconductor include a quaternary metal oxide such as an In—Sn—Ga—Zn—O-based oxide semiconductor; ternary metal oxides such as an In—Ga—Zn—O-based oxide semiconductor, an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, and an Sn—Al—Zn—O-based oxide semiconductor; binary metal oxides such as an In—Zn—O-based oxide semiconductor, an Sn—Zn—O-based oxide semiconductor, an Al—Zn—O-based oxide semiconductor, a Zn—Mg—O-based oxide semiconductor, an Sn—Mg—O-based oxide semiconductor, an In—Mg—O-based oxide semiconductor, and an In—Ga—O-based oxide semiconductor; an In—O-based oxide semiconductor; an Sn—O-based oxide semiconductor; and a Zn—O-based oxide semiconductor. In this specification, the term "In—Sn—Ga—Zn—O-based oxide semiconductor" means metal oxide containing Indium (In), tin (Sn), gallium (Ga), and zinc (Zn), and the composition ratio thereof is not particularly limited. The above oxide semiconductor may include silicon.

Moreover, the oxide semiconductor can be represented by the chemical formula, $InMO_3(ZnO)_m$ (m>0, m is not necessarily a natural number). Here, M represents one or more metal elements selected from Zn, Ga, Al, Mn, and Co. For example, M can be Ga, Ga and Al, Ga and Mn, Ga and Co, or the like.

In the semiconductor device according to one embodiment of the present invention, the threshold voltage of the p-channel transistor or the n-channel transistor which forms the complementary logic circuit is controlled by the potential supplied to the second gate electrode or the substrate potential. Therefore, when the potential of the gate electrode of the p-channel transistor or the n-channel transistor is switched from a high level to a low level or from a low level to a high level, one of the transistors can be made to turn off or a period where both of the transistors are turned on can be shortened. Thus, the through current which flows through channel formation regions of the p-channel transistor and the n-channel transistor can be reduced. Further, in the semiconductor device according to one embodiment of the present invention, the potential of the second gate electrode or the substrate potential can be held by the transistor with an extremely low off-state current; therefore, the threshold voltage which is set in accordance with the potential can be maintained even when a potential is not always supplied to the second gate electrode or a potential is not always supplied to a substrate.

Therefore, in the semiconductor device according to one embodiment of the present invention, a through current can be reduced; thus, power consumption can be suppressed. Alternatively, in the semiconductor device according to one embodiment of the present invention, a through current can be reduced; thus, heat generation can be suppressed.

DETAILED DESCRIPTION OF THE INVENTION

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

The present invention can be applied to manufacture any kind of semiconductor devices including microprocessors; integrated circuits such as image processing circuits, digital signal processors (DSPs), and microcontrollers; RF tags, and semiconductor display devices. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a circuit element using a semiconductor film is included in a driver circuit.

Embodiment 1

Figure 1A:
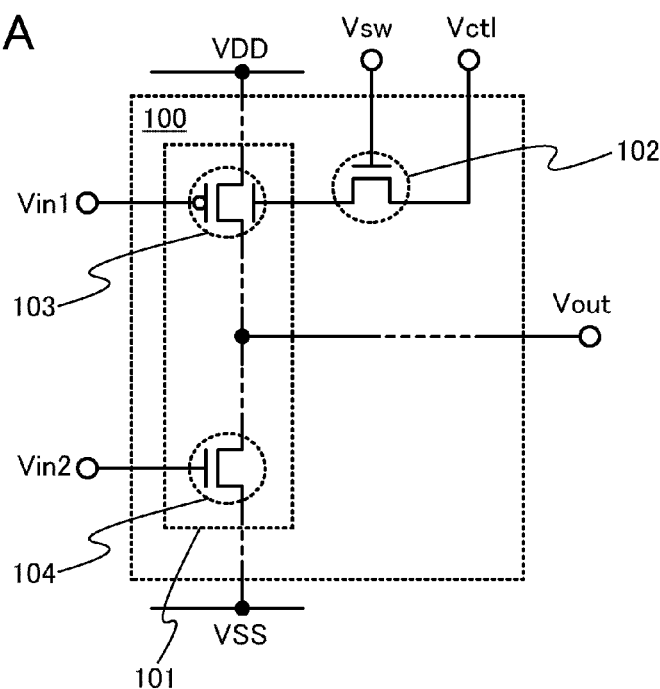
FIG. 1A is a diagram showing an example of the structure of a logic circuit.

FIG. 1A shows an example of the structure of a logic circuit which is used in a semiconductor device according to one embodiment of the present invention.

A logic circuit 100 in FIG. 1A includes a logic portion 101 for performing logical operation and a transistor 102 which functions as a switching element. The logic portion 101 includes at least a p-channel transistor 103 and an n-channel transistor 104. In the logic portion 101, logical operation to be performed is uniquely determined in accordance with the number and connection structure of the p-channel transistor 103 and the n-channel transistor 104. Then, one output value can be obtained from a plurality of input values by the logical operation which is performed in the logic portion 101.

Note that the input value means a logical value represented by a potential Vin of an input signal inputted into the logic circuit 100. Further, the output value means a logical value represented by a potential Vout of an output signal outputted from the logic circuit 100.

Specifically, the p-channel transistor 103 and the n-channel transistor 104 are connected to each other in series between a first node to which a high-level potential VDD is supplied and a second node to which a low-level potential VSS is supplied.

Note that in this specification, the term "connection" refers to electrical connection and corresponds to the state in which a current, a potential, or a voltage can be supplied or transmitted. Accordingly, a connection state means not only a state of direct connection but also a state of indirect connection through a circuit element such as a wiring, a resistor, a diode, or a transistor so that a current, a potential, or a voltage can be supplied or transmitted. Thus, another circuit element may be connected between the p-channel transistor 103 and the n-channel transistor 104 in the logic portion 101.

In addition, even when different components are connected to each other in a circuit diagram, there is actually a case where one conductive film has functions of a plurality of components such as a case where part of a wiring serves as an electrode. The term "connection" in this specification also means such a case where one conductive film has functions of a plurality of components.

In addition, a source electrode and a drain electrode of a transistor may be interchangeably referred to depending on polarity of the transistor and a difference between potentials given to the electrodes. In general, in an n-channel transistor, an electrode to which a lower potential is supplied is called a source electrode, and an electrode to which a higher potential is supplied is called a drain electrode. Further, in a p-channel transistor, an electrode to which a lower potential is supplied is called a drain electrode, and an electrode to which a higher potential is supplied is called a source electrode. Hereinafter, one of a source electrode and a drain electrode is referred to as a first terminal and the other of the source electrode and the drain electrode is referred to as a second terminal to describe connection relationship between the p-channel transistor 103 and the n-channel transistor 104.

Further, in this specification, the state in which the transistors are connected to each other in series refers to the state in which only one of a first terminal and a second terminal of a first transistor is connected to only one of a first terminal and a second terminal of a second transistor.

Specifically, in FIG. 1A, a first terminal of the p-channel transistor 103 is connected to the first node to which the high-level potential VDD is supplied, and a first terminal of the n-channel transistor 104 is connected to the second node to which the low-level potential VSS is supplied. In addition, a second terminal of the p-channel transistor 103 is connected to a second terminal of the n-channel transistor 104. The potential of a node at which the second terminal of the p-channel transistor 103 and the second terminal of the n-channel transistor 104 are connected to each other is outputted as a potential Vout of an output signal.

In one embodiment of the present invention, the transistor which forms the logic portion 101 is provided with a second gate electrode for controlling a threshold voltage, in addition to a normal gate electrode. Although FIG. 1A shows, as an example, the case where the p-channel transistor 103 is provided with a second gate electrode, one embodiment of the present invention is not limited to this structure. Alternatively, the n-channel transistor 104 may be provided with a second gate electrode instead of the p-channel transistor 103, or each of the p-channel transistor 103 and the n-channel transistor 104 may be provided with a second gate electrode.

Specifically, the p-channel transistor 103 or the n-channel transistor 104 of the logic portion 101 includes a first gate electrode, a second gate electrode, a semiconductor film positioned between the first gate electrode and the second gate electrode, a first insulating film positioned between the first gate electrode and the semiconductor film, a second insulating film positioned between the second gate electrode and the semiconductor film, and a source electrode and a drain electrode in contact with the semiconductor film. The threshold voltage of the transistor having the second gate electrode is controlled by the height of the potential of the second gate electrode, more specifically by the potential difference between the source electrode and the second gate electrode.

Further, the transistor 102 which functions as a switching element controls the supply of a potential to the second gate electrode. Specifically, a potential Vctl is supplied to the second gate electrode through the transistor 102 when the transistor 102 is turned on, and the potential of the second gate electrode is held when the transistor 102 is turned off. Note that the switching of the transistor 102 is controlled by a potential Vsw supplied to a gate electrode of the transistor 102.

FIG. 1A shows an example in which a first terminal of the transistor 102 is connected to the second gate electrode of the p-channel transistor 103, and a second terminal of the transistor 102 is connected to a node to which the potential Vctl is supplied.

In one embodiment of the present invention, the transistor 102 has a channel formation region which includes a semiconductor material whose band gap is wider than that of silicon and whose intrinsic carrier density is lower than that of silicon. The off-state current can be sufficiently reduced by using such a semiconductor material for the channel formation region of the transistor 102.

Unless otherwise specified, in the case of an n-channel transistor, an off-state current in this specification is a current which flows between a source electrode and a drain electrode when a potential of the drain electrode is higher than that of the source electrode or that of a gate electrode while the potential of the gate electrode is less than or equal to zero when a reference potential is the potential of the source electrode. Alternatively, in this specification, in the case of a p-channel transistor, an off-state current is current which flows between a source electrode and a drain electrode when a potential of the drain electrode is lower than that of the source electrode or that of a gate electrode while the potential of the gate electrode is greater than or equal to zero when a reference potential is the potential of the source electrode.

As one example of a semiconductor material whose band gap is wider than that of a silicon semiconductor and whose intrinsic carrier density is lower than that of silicon, a compound semiconductor such as silicon carbide (SiC) or gallium nitride (GaN), an oxide semiconductor formed of metal oxide such as zinc oxide (ZnO), or the like can be employed. Note that a compound semiconductor such as silicon carbide or gallium nitride is required to be a single crystal, and crystal growth at a temperature extremely higher than a process temperature of the oxide semiconductor or epitaxial growth over a special substrate is needed in order to obtain a single crystal material. On the other hand, an oxide semiconductor can be formed even at room temperature; therefore, film formation can be performed over a silicon wafer that can be obtained easily or a glass substrate which is inexpensive and can be applied when the size of a substrate is increased; thus, the mass productivity is high. In addition, it is possible to stack a semiconductor element including an oxide semiconductor on an integrated circuit including a normal semiconductor material such as silicon or gallium. Further, in the case where a crystalline oxide semiconductor is to be obtained in order to improve the property of a transistor (e.g., field-effect mobility), the crystalline oxide semiconductor can be easily obtained by heat treatment at 200° C. to 800° C.

Further, in one embodiment of the present invention, the above semiconductor material whose band gap is wide may be included at least in an active layer of the transistor 102 which functions as a switching element. In the following description, the case where an oxide semiconductor with the above advantages is used as a semiconductor film of the transistor 102 is given as an example.

Further, for an active layer of the n-channel transistor 104 or the p-channel transistor 103 of the logic portion 101, the amorphous, microcrystalline, polycrystalline, or single crystal semiconductors such as silicon, germanium, or the like, other than the oxide semiconductor may be used. In particular, in the case where the logic circuit 100 is used in a circuit where high-speed operation is required, it is preferable to use polycrystalline silicon, single crystal silicon, polycrystalline germanium, or single crystal germanium, the mobility of which is higher than that of an oxide semiconductor, for the n-channel transistor 104 or the p-channel transistor 103 of the logic portion 101.

Alternatively, an oxide semiconductor may be used for the active layer of the n-channel transistor 104 of the logic portion 101. If a p-channel transistor can be manufactured using an oxide semiconductor, an oxide semiconductor may be used for the active layer of the p-channel transistor 103 of the logic portion 101. When an oxide semiconductor is used for the active layers of all of the transistors which form the logic circuit 100, a process can be simplified.

Note that although the logic circuit 100 includes one transistor 102 which functions as a switching element in FIG. 1A, the present invention is not limited to this structure. In one embodiment of the present invention, a plurality of transistors may function as one switching element. In the case where a plurality of transistors which serve as a switching element are included in the logic circuit 100, the plurality of transistors may be connected to each other in parallel, in series, or in combination of parallel connection and series connection.

Further, the state in which the transistors are connected to each other in parallel refers to the state in which a first terminal of a first transistor is connected to a first terminal of a second transistor and a second terminal of the first transistor is connected to a second terminal of the second transistor.

The transistor 102 which functions as a switching element is different from the p-channel transistor 103 or the n-channel transistor 104 of the logic portion 101, and a gate electrode may be provided at least on one side of the active layer. However, the present invention is not limited to this structure, and the transistor which functions as a switching element may include a pair of gate electrodes having an active layer provided therebetween in a manner similar to that of the p-channel transistor 103 or the n-channel transistor 104 of the logic portion 101.

A potential Vin1 of an input signal is supplied to the first gate electrode of the p-channel transistor 103. A potential Vin2 of an input signal is supplied to the gate electrode of the n-channel transistor 104. Note that the two potentials Vin1 and Vin2 of the input signals may have the same height or a predetermined potential difference. However, the logical value of the potential Vin1 accords with the logical value of the potential Vin2.

The operation of the logic circuit 100 is described below by giving the case where the potentials Vin1 and Vin2 have the same height as an example.

In FIG. 1A, the switching of the p-channel transistor 103 is performed in accordance with a gate voltage Vgs which corresponds to a potential difference between the first gate electrode and the source electrode. Note that the gate voltage Vgs of the p-channel transistor 103 is a potential difference between the potential Vin1 of the input signal supplied to the first gate electrode and the potential VDD. Thus, when the threshold voltage of the p-channel transistor 103 is Vthp and the relation of Vthp<0 is satisfied, the p-channel transistor 103 is turned on when the relation of Vin1−VDD≤−|Vthp| is satisfied and is turned off when the relation of Vin1−VDD>−|Vthp| is satisfied.

In addition, the switching of the n-channel transistor 104 is also performed in accordance with a gate voltage Vgs which corresponds to a potential difference between the gate electrode and the source electrode. Note that the gate voltage Vgs of the n-channel transistor 104 is a potential difference between the potential Vin2 of the input signal supplied to the gate electrode and the potential VSS. Thus, when the threshold voltage of the n-channel transistor 104 is Vthn and the relation of Vthn>0 is satisfied, the n-channel transistor 104 is turned on when the relation of Vin2−VSS≥|Vthn| is satisfied and is turned off when the relation of Vin2−VSS<|Vthn| is satisfied.

In order to suppress a through current, it is preferable to operate the p-channel transistor 103 and the n-channel transistor 104 so that, when one of the transistors is turned on, the other of the transistors is turned off. That is, the value of the threshold voltage Vthp is controlled so that the p-channel transistor 103 and the n-channel transistor 104 are prevented from being turned on at the same time.

When the equation of Vin1=Vin2=Vin is satisfied, the potential Vin at which the p-channel transistor 103 and the n-channel transistor 104 are turned on at the same time is in the range of VSS+|Vthn|≤Vin≤VDD−|Vthp|. Thus, in order to suppress a through current, it is preferable to increase the absolute value of the threshold voltage Vthp and narrow the range of the potential Vin.

Further, the absolute value of the threshold voltage Vthp tends to be larger as the potential Vctl supplied to the second gate electrode is increased. On the other hand, the absolute value of the threshold voltage Vthp tends to be smaller as the potential Vctl supplied to the second gate electrode is reduced. Thus, in one embodiment of the present invention, a through current can be suppressed by making the potential Vctl higher than the potential VSS and increasing the absolute value of the threshold voltage Vthp.

Note that when the absolute value of the threshold voltage Vthp is further increased, the p-channel transistor 103 and the n-channel transistor 104 can be prevented from being turned on at the same time despite the value of the potential Vin; thus, a through current can be suppressed. However, when the absolute value of the threshold voltage Vthp is too large, a period appears where the p-channel transistor 103 and the n-channel transistor 104 are turned off at the same time, which depends on the value of the potential Vin. During the period where the p-channel transistor 103 and the n-channel transistor 104 are turned off at the same time, the node at which the second terminal of the p-channel transistor 103 and the second terminal of the n-channel transistor 104 are connected to each other is not supplied with both the potential VDD and the potential VSS. Thus, in order to prevent the potential Vout of the output signal from being unstable, it is preferable to control the threshold voltage Vthp so that the value of VDD−|Vthp| does not become smaller than the value of VSS+|Vthn|.

Note that the example in which the threshold voltage Vthp of the p-channel transistor 103 is controlled by the potential supplied to the second gate electrode is described in this embodiment. However, in the semiconductor device according to one embodiment of the present invention, the n-channel transistor 104 may be provided with a second gate electrode and the threshold voltage Vthn of the n-channel transistor 104 may be controlled by the potential supplied to the second gate electrode.

In the case of the n-channel transistor 104, the absolute value of the threshold voltage Vthn tends to be smaller as the potential supplied to the second gate electrode is increased. On the other hand, the absolute value of the threshold voltage Vthn tends to be larger as the potential supplied to the second gate electrode is reduced. Thus, in the case of the n-channel transistor 104, a through current can be suppressed by reducing the potential of the second gate electrode to be lower than the potential VSS and increasing the absolute value of the threshold voltage Vthn.

Similar to the case of the threshold voltage Vthp, when the absolute value of the threshold voltage Vthn is too large, a period appears where the p-channel transistor 103 and the n-channel transistor 104 are turned off at the same time, which depends on the value of the potential Vin. Thus, in order to prevent the potential Vout of the output signal from being unstable, it is preferable to control the threshold voltage Vthn so that the value of VDD−|Vthp| does not become smaller than the value of VSS+|Vthn|.

Figure 5A:
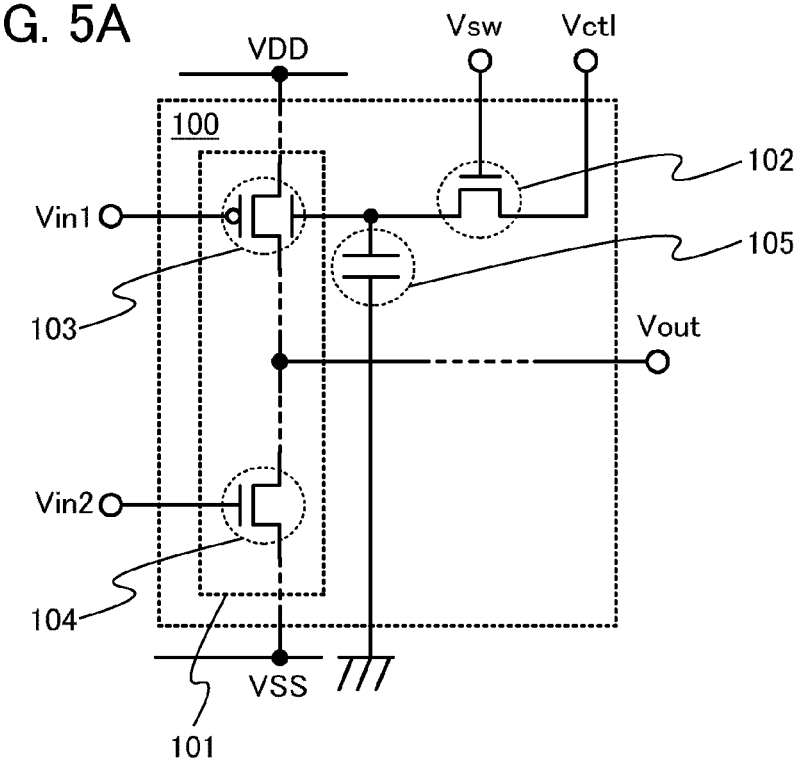
FIGS. 5A and 5B are diagrams each showing an example of the structure of a logic circuit.

Further, in the semiconductor device according to one embodiment of the present invention, a storage capacitor may be connected to the second gate electrode in order to hold the potential of the second gate electrode certainly. FIG. 5A shows an example of the structure of the logic circuit 100 including a storage capacitor 105.

In FIG. 5A, one of a pair of electrodes of the storage capacitor 105 is connected to the second gate electrode of the p-channel transistor 103, and the other of the pair of electrodes is connected to the node to which a fixed potential is supplied. With the above structure, the potential of the second gate electrode of the p-channel transistor 103 can be held longer during a period where the transistor 102 is off.

Figure 5B:
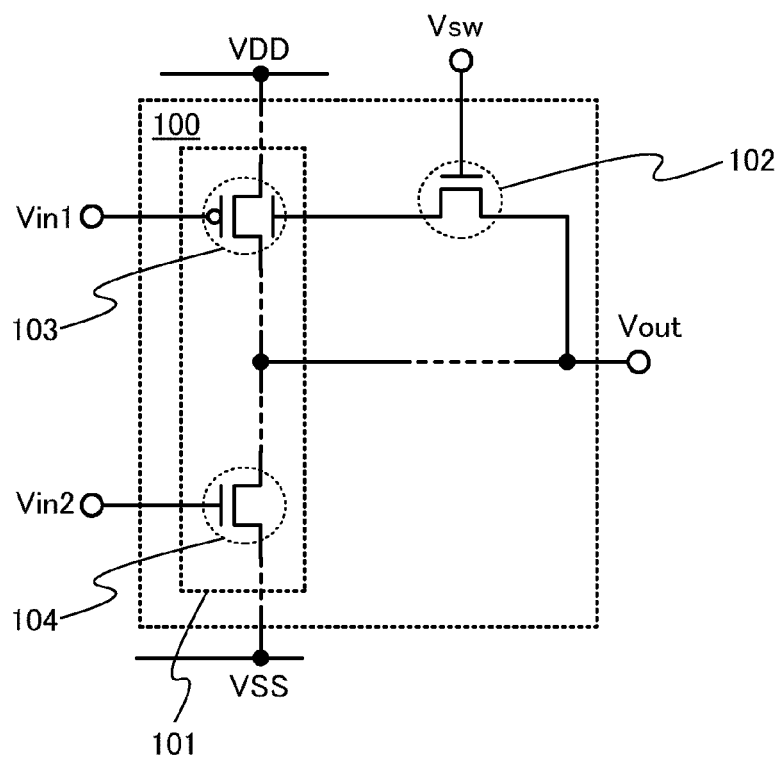

Alternatively, in the semiconductor device according to one embodiment of the present invention, a potential Vout of an output signal may be supplied to the second gate electrode. FIG. 5B shows an example of the structure of the logic circuit 100, in which the connection structure of the transistor 102 is different from that in FIG. 1A.

In FIG. 5B, a first terminal of the transistor 102 is connected to the second gate electrode of the p-channel transistor 103, and a second terminal of the transistor 102 is connected to a node to which a potential Vout of an output signal is supplied. With the above structure, a wiring for supplying a potential Vctl to the logic circuit 100 can be omitted.

Note that in FIGS. 5A and 5B, the potential of the second gate electrode of the p-channel transistor 103 is held by the transistor 102 with a low off-state current. However, as described above, the n-channel transistor 104 may be provided with a second gate electrode and the potential of the second gate electrode of the n-channel transistor 104 may be held by the transistor 102 with a low off-state current. Alternatively, each of the p-channel transistor 103 and the n-channel transistor 104 may be provided with a second gate electrode and the respective potentials may be held by transistors with a low off-state current.

In the semiconductor device according to one embodiment of the present invention, the potential of the second gate electrode of the p-channel transistor 103 or the n-channel transistor 104 is held by the transistor 102 with an extremely low off-state current. With the above structure, the potential of the second gate electrode can be held and the threshold voltage of the p-channel transistor 103 or the n-channel transistor 104 can be set to a predetermined value even when a potential is not always supplied to the second gate electrode. Thus, an advantageous effect of a reduction of a through current can be obtained even when a potential is not always supplied to the second gate electrode. Further, for example, in the case where the supply of various signals and potentials to the logic portion 101 is stopped and then the supply of the various signals and potentials is started again, an advantageous effect of reducing a through current can be obtained stably even when rise of the signals and potentials are unstable.

Figure 9:
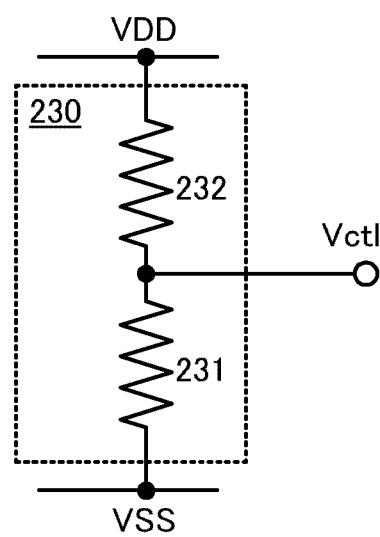
FIG. 9 is a diagram showing an example of the structure of a potential control circuit.

Next, FIG. 9 shows an example of a circuit for generating the potential Vctl supplied to the second gate electrode. A circuit 230 in FIG. 9 has a structure in which a resistor 231 and a resistor 232 are connected to each other in series between a first node to which a high-level potential VDD is supplied and a second node to which a low-level potential VSS is supplied. The potential of a node at which the resistor 231 and the resistor 232 are connected to each other is outputted as the potential Vctl.

Note that the structure of the circuit for generating the potential Vctl supplied to the second gate electrode is not limited to the structure in FIG. 9. Alternatively, the potential Vctl may be generated by providing a constant voltage circuit.

Note that the circuit 230 in FIG. 9 can generate the potential Vctl using the potential VDD and the potential VSS supplied to the logic circuit 100; therefore, the number of wirings for supplying potentials to the circuit 230 and the logic circuit 100 can be reduced as compared to the case where the potential Vctl is generated by a constant voltage circuit.

Figure 1B:
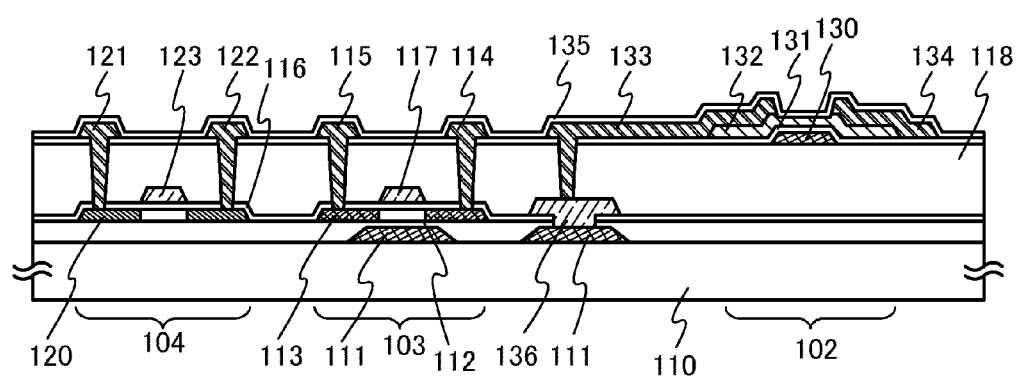
FIG. 1B is a diagram showing an example of a cross-sectional view of a logic circuit.

Next, the structures of the p-channel transistor 103, the n-channel transistor 104, and the transistor 102 which are used in the logic circuit 100 will be described. FIG. 1B shows an example of the cross-sectional structure of the p-channel transistor 103, the n-channel transistor 104, and the transistor 102.

In FIG. 1B, the p-channel transistor 103, the n-channel transistor 104, and the transistor 102 which functions as a switching element, which form the logic portion 101, are formed over a substrate 110 having an insulating surface.

Specifically, the p-channel transistor 103 includes, over the substrate 110, a second gate electrode 111, an insulating film 112 over the second gate electrode 111, a semiconductor film 113 which overlaps with the second gate electrode 111 with the insulating film 112 provided therebetween and functions as an active layer including silicon, a source electrode 114 and a drain electrode 115 connected to the semiconductor film 113, an insulating film 116 over the semiconductor film 113, and a first gate electrode 117 which is over the insulating film 116 and overlaps with the semiconductor film 113.

In addition, the n-channel transistor 104 includes a semiconductor film 120 which functions as an active layer including silicon over the insulating film 112, a source electrode 121 and a drain electrode 122 connected to the semiconductor film 120, the insulating film 116 over the semiconductor film 120, and a gate electrode 123 which is over the insulating film 116 and overlaps with the semiconductor film 120.

The p-channel transistor 103 and the n-channel transistor 104 are covered with an insulating film 118 so that the source electrode 114 and the drain electrode 115, and the source electrode 121 and the drain electrode 122 are exposed, respectively.

The transistor 102 includes, over the insulating film 118, a gate electrode 130, an insulating film 131 over the gate electrode 130, an oxide semiconductor film 132 which overlaps with the gate electrode 130 with the insulating film 131 provided therebetween and functions as an active layer, and a source electrode 133 and a drain electrode 134 in contact with the oxide semiconductor film 132. An insulating film 135 is formed over the oxide semiconductor film 132, the source electrode 133, and the drain electrode 134 and may be included as a component of the transistor 102.

The source electrode 133 is connected to the second gate electrode 111. Specifically, FIG. 1B shows an example in which the second gate electrode 111 is connected to a wiring 136 through a contact hole formed in the insulating film 112 and the insulating film 116, and the wiring 136 is connected to the source electrode 133 through a contact hole formed in the insulating film 118 and the insulating film 131.

In the semiconductor device according to one embodiment of the present invention, the threshold voltage of the p-channel transistor 103 or the n-channel transistor 104 which forms the complementary logic circuit 100 is controlled by the potential supplied to the second gate electrode. Therefore, when the potential of the gate electrode of the p-channel transistor 103 or the n-channel transistor 104 is switched from a high level to a low level or from a low level to a high level, one of the transistors can be made to turn off or a period where both of the transistors are turned on can be shortened. Thus, the through current which flows through channel formation regions of the p-channel transistor 103 and the n-channel transistor 104 can be reduced. Further, in the semiconductor device according to one embodiment of the present invention, the potential of the second gate electrode can be held by the transistor 102 with an extremely low off-state current; therefore, the threshold voltage which is set in accordance with the potential Vctl can be maintained even when a potential is not always supplied to the second gate electrode.

Therefore, in the semiconductor device according to one embodiment of the present invention, a through current can be reduced; thus, power consumption can be suppressed. Alternatively, in the semiconductor device according to one embodiment of the present invention, a through current can be reduced; thus, heat generation can be suppressed and reliability of the semiconductor device can be improved.

Embodiment 2

In this embodiment, another example of the structure of a logic circuit which is used in a semiconductor device according to one embodiment of the present invention will be shown.

Figure 2A:
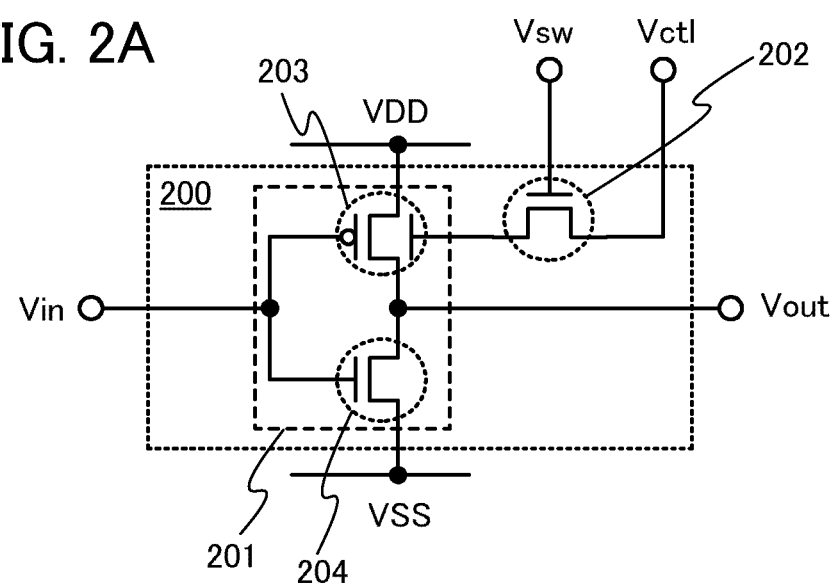
FIG. 2A is a diagram showing an example of the structure of an inverter.

A logic circuit 200 in FIG. 2A includes a logic portion 201 for performing logical operation and a transistor 202 with a low off-state current, which functions as a switching element. The logic portion 201 includes a p-channel transistor 203 and an n-channel transistor 204. FIG. 2A shows, as an example, the case where the logic portion 201 is an inverter including the p-channel transistor 203 and the n-channel transistor 204.

Specifically, in the logic portion 201, a gate electrode of the p-channel transistor 203 and a gate electrode of the n-channel transistor 204 are connected to each other. A potential Vin of an input signal inputted into the logic circuit 200 is supplied to the gate electrode of the p-channel transistor 203 and the gate electrode of the n-channel transistor 204. Further, a first terminal of the p-channel transistor 203 is connected to a first node to which a high-level potential VDD is supplied, and a first terminal of the n-channel transistor 204 is connected to a second node to which a low-level potential VSS is supplied. In addition, a second terminal of the p-channel transistor 203 is connected to a second terminal of the n-channel transistor 204. That is, the p-channel transistor 203 and the n-channel transistor 204 are connected to each other in series between the first node to which the high-level potential VDD is supplied and the second node to which the low-level potential VSS is supplied. The potential of a node at which the second terminal of the p-channel transistor 203 and the second terminal of the n-channel transistor 204 are connected to each other is outputted as a potential Vout of an output signal.

In FIG. 2A, the p-channel transistor 203 is provided with a second gate electrode for controlling a threshold voltage, in addition to a normal gate electrode.

Although FIG. 2A shows, as an example, the case where the p-channel transistor 203 is provided with the second gate electrode, one embodiment of the present invention is not limited to this structure. Alternatively, the n-channel transistor 204 may be provided with a second gate electrode instead of the p-channel transistor 203, or each of the p-channel transistor 203 and the n-channel transistor 204 may be provided with a second gate electrode.

Further, the transistor 202 controls the supply of a potential to the second gate electrode. FIG. 2A shows an example in which a first terminal of the transistor 202 is connected to the second gate electrode of the p-channel transistor 203, and a second terminal of the transistor 202 is connected to a node to which a potential Vctl is supplied. Specifically, the potential Vctl is supplied to the second gate electrode through the transistor 202 when the transistor 202 is turned on, and the potential of the second gate electrode is held when the transistor 202 is turned off. Note that the switching of the transistor 202 is controlled by a potential Vsw supplied to the gate electrode of the transistor 202.

Figure 2B:
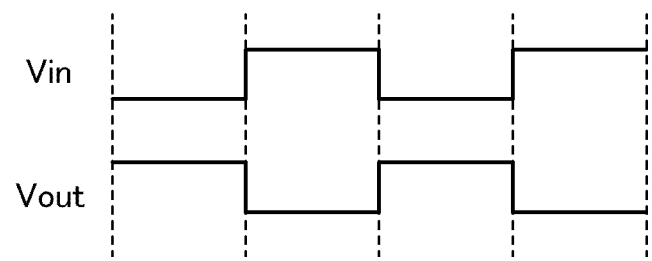
FIG. 2B is a timing chart thereof.

FIG. 2B shows an example of an ideal timing chart of the potential Vin of the input signal and the potential Vout of the output signal in the logic circuit 200 in FIG. 2A.

As illustrated in FIG. 2B, when the potential Vin is at a low level, the p-channel transistor 203 is turned on and the n-channel transistor 204 is turned off. Therefore, the potential VDD is supplied to the second terminal of the p-channel transistor 203. Thus, the potential VDD is outputted from the logic circuit 200 as the potential Vout of the output signal. On the other hand, when the potential Vin is at a high level, the p-channel transistor 203 is turned off and the n-channel transistor 204 is turned on. Therefore, the potential VSS is supplied to the second terminal of the n-channel transistor 204. Thus, the potential VSS is outputted from the logic circuit 200 as the potential Vout of the output signal.

Note that the timing chart in FIG. 2B shows a state of the instantaneous change of the potential Vin. However, in practice, it slightly takes time until the potential Vin is completely shifted from a low level to a high level or from a high level to a low level.

Figure 3:
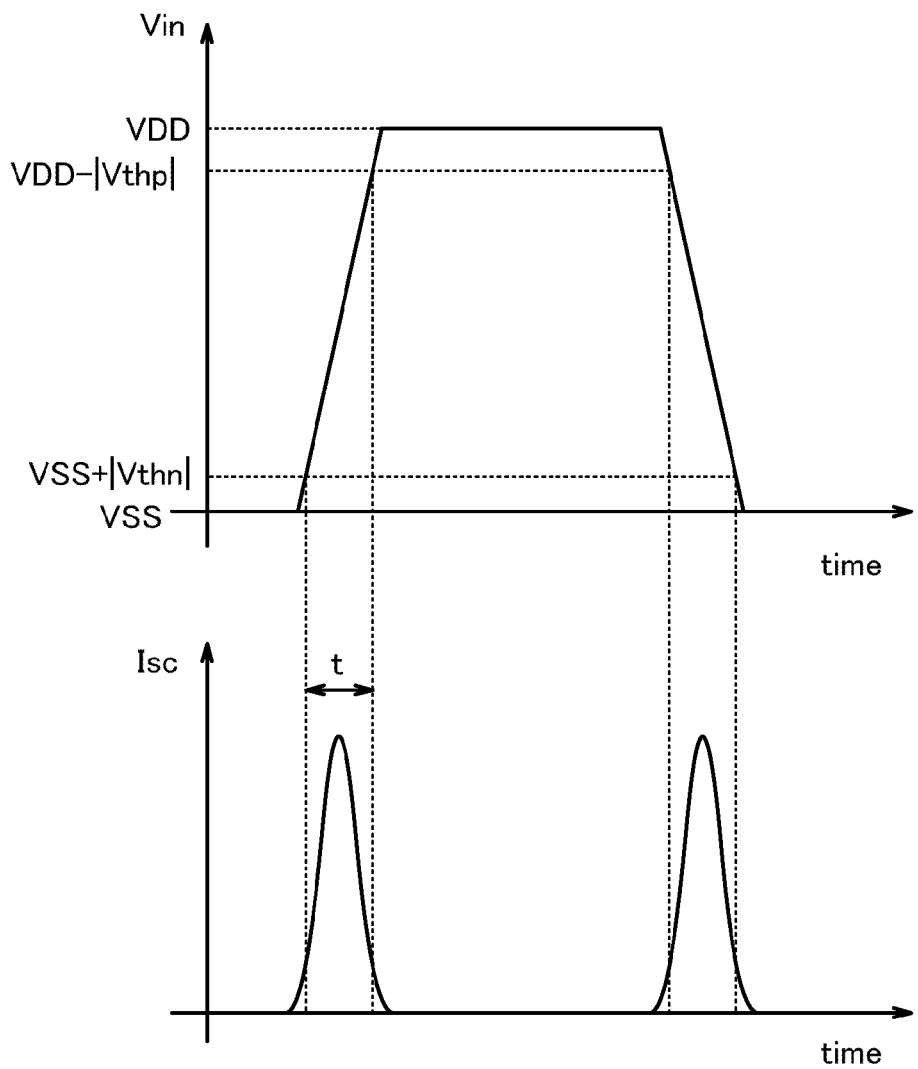
FIG. 3 is a timing chart of a potential Vin and a graph showing an example of change of a through current Isc over time.

FIG. 3 shows an example of a timing chart of the potential Vin which is completely shifted from a low level to a high level and then shifted from a high level to a low level. In addition, FIG. 3 also shows an example of change of a through current Isc over time, which flows through the p-channel transistor 203 and the n-channel transistor 204. Note that the timing chart of the potential Vin accords with the through current Isc over time in terms of a time axis.

In the timing chart of the potential Vin in FIG. 3, the potential Vin is varied from the low-level potential VSS to the high-level potential VDD during a predetermined time. In addition, the potential Vin is varied from the high-level potential VDD to the low-level potential VSS during a predetermined time.

In the case where the potential Vin is varied as shown in FIG. 3, the p-channel transistor 203 and the n-channel transistor 204 are turned on at the same time during a period t where the potential Vin is within the range of VSS+ |Vthn|≤Vin≤VDD−|Vthp|. Thus, as shown in FIG. 3, the through current Isc is increased during the period t.

Figure 4:
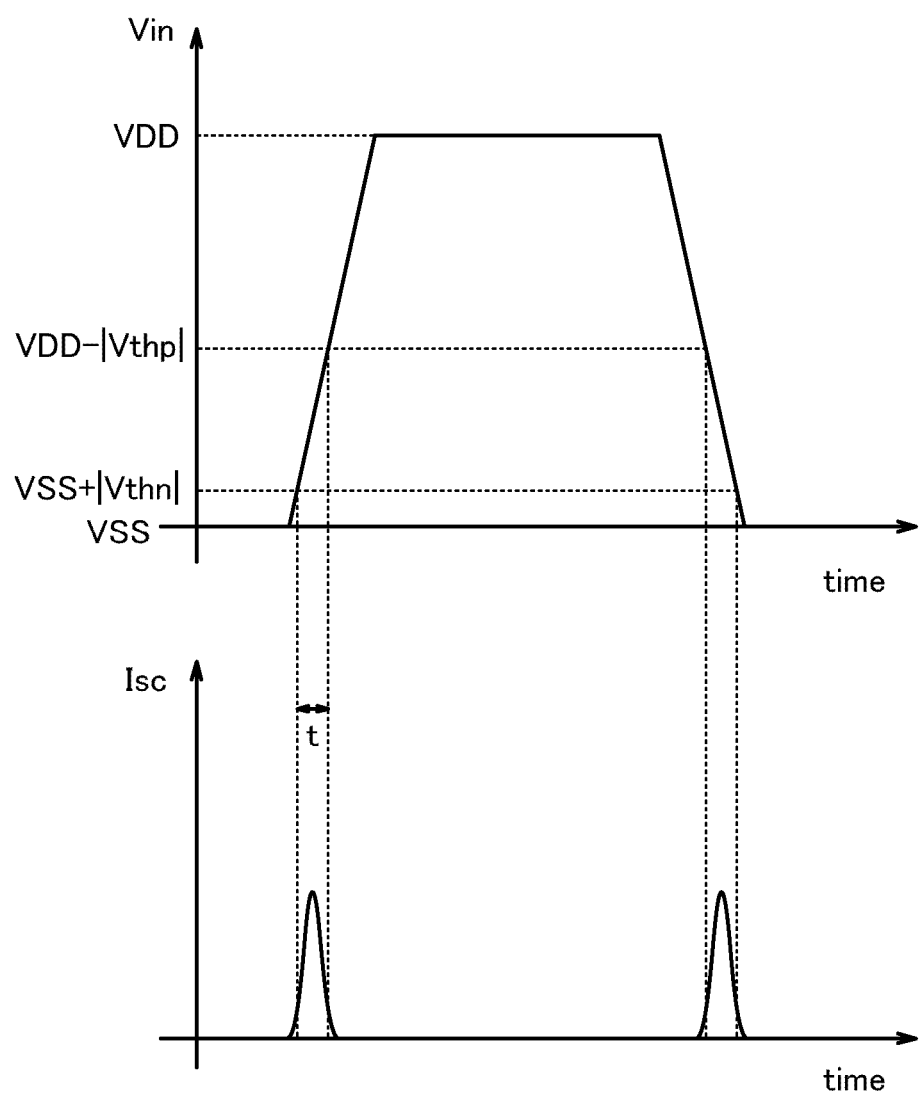
FIG. 4 is a timing chart of a potential Vin and a graph showing an example of change of a through current Isc over time.

Next, FIG. 4 shows an example of a timing chart of a potential Vin and an example of change of a through current Isc over time, in the case where the absolute value of a threshold voltage Vthp is increased. The absolute value of the threshold voltage Vthp in FIG. 4 is larger than that in FIG. 3; therefore, the period t within the range of VSS+ |Vthn|≤Vin≤VDD−|Vthp| can be shortened. That is, the period t where the p-channel transistor 203 and the n-channel transistor 204 are turned on at the same time can be shortened than the period t in FIG. 3. Thus, as shown in FIG. 4, the through current Isc generated during the period t is lower than that in FIG. 3.

Further, in the semiconductor device according to one embodiment of the present invention, the potential of the second gate electrode can be held by the transistor 202 with an extremely low off-state current; therefore, the threshold voltage which is set in accordance with the potential Vctl can be maintained even when a potential is not always supplied to the second gate electrode.

Therefore, in the semiconductor device according to one embodiment of the present invention, a through current can be reduced even when a potential is not always supplied to a second gate electrode; thus, power consumption can be suppressed. Alternatively, in the semiconductor device according to one embodiment of the present invention, a through current can be reduced even when a potential is not always supplied to a second gate electrode; thus, heat generation can be suppressed and reliability of the semiconductor device can be improved.

Figure 8:
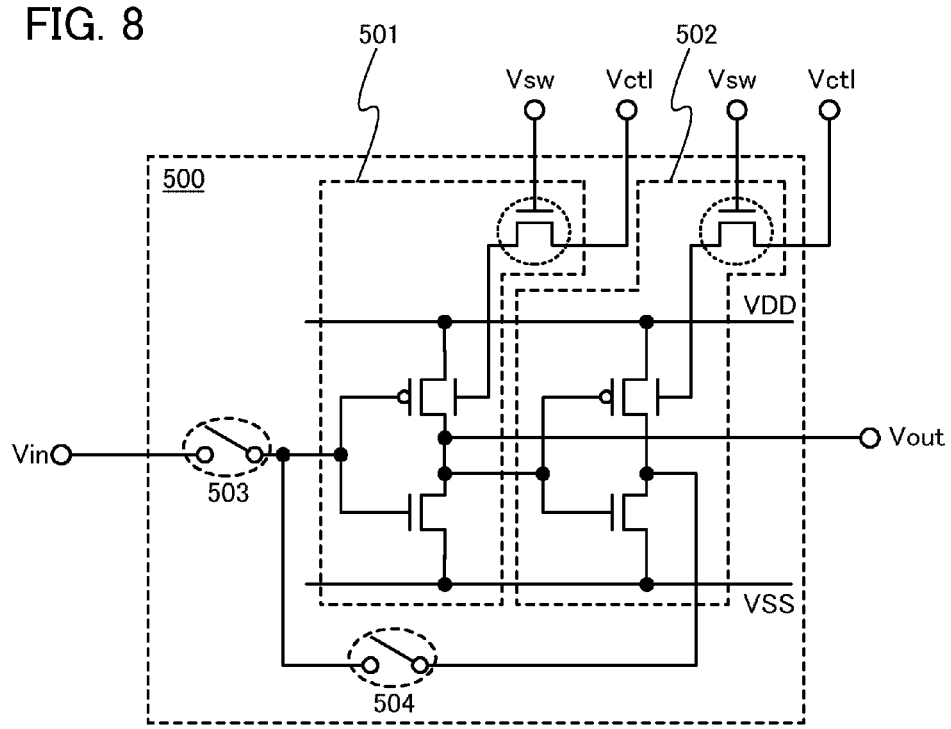
FIG. 8 is a diagram showing an example of the structure of a register.

Next, FIG. 8 shows an example of the structure of a register including the inverter in FIG. 2A.

A register 500 in FIG. 8 includes an inverter 501, an inverter 502, a switching element 503, and a switching element 504. The inverter 501 and the inverter 502 each have a structure similar to that of the logic circuit 200 in FIG. 2A. The switching element 503 controls the input of a potential Vin of an input signal into an input terminal of the inverter 501. The potential of an output terminal of the inverter 501 is supplied to a circuit of a subsequent stage of the register 500 as a potential Vout of an output signal. The output terminal of the inverter 501 is connected to an input terminal of the inverter 502, and an output terminal of the inverter 502 is connected to the input terminal of the inverter 501 through the switching element 504.

When the switching element 503 is turned off and the switching element 504 is turned on, the potential Vin of the input signal which is inputted through the switching element 503 is held in the register 500.

This embodiment can be implemented in combination with any of the above embodiments.

Embodiment 3

In this embodiment, another example of the structure of a logic circuit which is used in a semiconductor device according to one embodiment of the present invention will be shown.

Figure 6A:
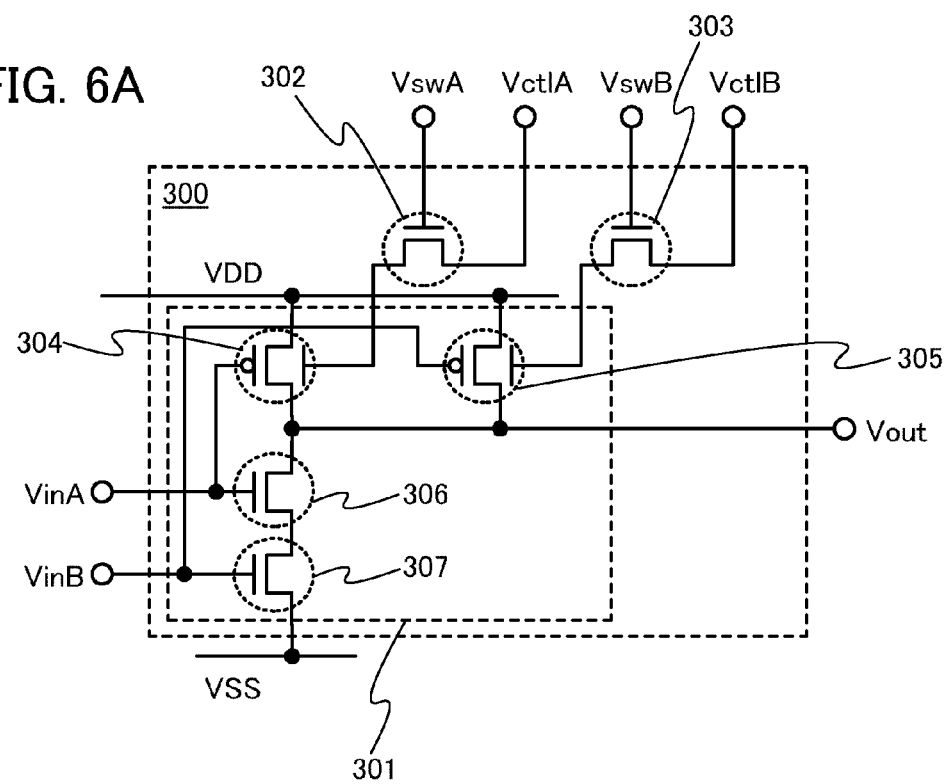
FIG. 6A is a diagram showing an example of the structure of a NAND.

A logic circuit 300 in FIG. 6A includes a logic portion 301 for performing logical operation and a transistor 302 and a transistor 303 with a low off-state current, which each function as a switching element. The logic portion 301 includes a p-channel transistor 304, a p-channel transistor 305, an n-channel transistor 306, and an n-channel transistor 307. FIG. 6A shows, as an example, the case where the logic portion 301 is a NAND including the p-channel transistor 304, the p-channel transistor 305, the n-channel transistor 306, and the n-channel transistor 307.

Specifically, in the logic portion 301, a gate electrode of the p-channel transistor 304 and a gate electrode of the n-channel transistor 306 are connected to each other. A potential VinA of an input signal inputted into the logic circuit 300 is supplied to the gate electrode of the p-channel transistor 304 and the gate electrode of the n-channel transistor 306. In addition, a gate electrode of the p-channel transistor 305 and a gate electrode of the n-channel transistor 307 are connected to each other. A potential VinB of an input signal inputted into the logic circuit 300 is supplied to the gate electrode of the p-channel transistor 305 and the gate electrode of the n-channel transistor 307.

Further, a first terminal of the p-channel transistor 304 and a first terminal of the p-channel transistor 305 are connected to a first node to which a high-level potential VDD is supplied. A first terminal of the n-channel transistor 307 is connected to a second node to which a low-level potential VSS is supplied. A second terminal of the n-channel transistor 307 is connected to a first terminal of the n-channel transistor 306. A second terminal of the n-channel transistor 306, a second terminal of the p-channel transistor 304, and a second terminal of the p-channel transistor 305 are connected to one another, and the potential of a node thereof is outputted as a potential Vout of an output signal.

That is, in the logic portion 301, the p-channel transistor 304 and the n-channel transistor 306 to which the input signal having one logical value is supplied are connected to each other in series between the first node to which the high-level potential VDD is supplied and the second node to which the low-level potential VSS is supplied. In addition, in the logic portion 301, the p-channel transistor 305 and the n-channel transistor 307 to which the input signal having another logical value is supplied are connected to each other in series between the first node to which the high-level potential VDD is supplied and the second node to which the low-level potential VSS is supplied.

In FIG. 6A, the p-channel transistor 304 and the p-channel transistor 305 are each provided with a second gate electrode for controlling a threshold voltage, in addition to a normal gate electrode.

Note that since the p-channel transistor 304 and the p-channel transistor 305 are connected to each other in parallel in FIG. 6A, it is preferable that each of the above transistors be provided with a second gate electrode in order to reduce a through current.

Alternatively, in one embodiment of the present invention, the n-channel transistor 306 may be provided with a second gate electrode instead of the p-channel transistor 304, or each of the p-channel transistor 304 and the n-channel transistor 306 may be provided with a second gate electrode. Further alternatively, in one embodiment of the present invention, the n-channel transistor 307 may be provided with a second gate electrode instead of the p-channel transistor 305, or each of the p-channel transistor 305 and the n-channel transistor 307 may be provided with a second gate electrode.

Further, the transistor 302 controls the supply of a potential to the second gate electrode of the p-channel transistor 304.

FIG. 6A shows an example in which a first terminal of the transistor 302 is connected to the second gate electrode of the p-channel transistor 304, and a second terminal of the transistor 302 is connected to a node to which a potential VctlA is supplied. Specifically, the potential VctlA is supplied to the second gate electrode of the p-channel transistor 304 through the transistor 302 when the transistor 302 is turned on, and the potential of the second gate electrode is held when the transistor 302 is turned off. Note that the switching of the transistor 302 is controlled by a potential VswA supplied to the gate electrode of the transistor 302.

The transistor 303 controls the supply of a potential to the second gate electrode of the p-channel transistor 305. FIG. 6A shows an example in which a first terminal of the transistor 303 is connected to the second gate electrode of the p-channel transistor 305, and a second terminal of the transistor 303 is connected to a node to which a potential VctlB is supplied. Specifically, the potential VctlB is supplied to the second gate electrode of the p-channel transistor 305 through the transistor 303 when the transistor 303 is turned on, and the potential of the second gate electrode is held when the transistor 303 is turned off. Note that the switching of the transistor 303 is controlled by a potential VswB supplied to the gate electrode of the transistor 303.

Figure 6B:
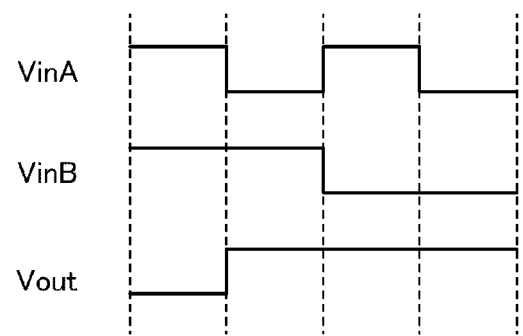
FIG. 6B is a timing chart thereof.

FIG. 6B shows an example of an ideal timing chart of the potentials VinA and VinB of the input signals and the potential Vout of the output signal in the logic circuit 300 in FIG. 6A.

As illustrated in FIG. 6B, when the potential VinA is at a high level and the potential VinB is at a high level, the p-channel transistor 304 and the p-channel transistor 305 are turned off, and the n-channel transistor 306 and the n-channel transistor 307 are turned on. Therefore, the potential VSS is outputted from the logic circuit 300 as the potential Vout of the output signal. In addition, when the potential VinA is at a low level and the potential VinB is at a high level, the p-channel transistor 305 and the n-channel transistor 306 are turned off, and the p-channel transistor 304 and the n-channel transistor 307 are turned on. Therefore, the potential VDD is outputted from the logic circuit 300 as the potential Vout of the output signal. Moreover, when the potential VinA is at a high level and the potential VinB is at a low level, the p-channel transistor 304 and the n-channel transistor 307 are turned off, and the p-channel transistor 305 and the n-channel transistor 306 are turned on. Therefore, the potential VDD is outputted from the logic circuit 300 as the potential Vout of the output signal. Further, when the potential VinA is at a low level and the potential VinB is at a low level, the n-channel transistor 306 and the n-channel transistor 307 are turned off, and the p-channel transistor 304 and the p-channel transistor 305 are turned on. Therefore, the potential VDD is outputted from the logic circuit 300 as the potential Vout of the output signal.

Note that the timing chart in FIG. 6B shows a state of the instantaneous change of the potential VinA and the potential VinB. However, in practice, it slightly takes time until the potential VinA and the potential VinB are completely shifted from a low level to a high level or from a high level to a low level. As described in the above embodiment, a through current flows easily during this period where the potentials shift.

In one embodiment of the present invention, when the threshold voltage of the p-channel transistor 304 is VthpA and the threshold voltage of the n-channel transistor 306 is VthnA, by making the potential VctlA high and the absolute value of the threshold voltage VthpA large, a period where the potential VinA is within the range of VSS+ |VthnA|≤VinA≤VDD−|VthpA| can be shortened. That is, the period where the p-channel transistor 304 and the n-channel transistor 306 are turned on at the same time can be shortened. Thus, the through current generated during the period can be reduced.

Further, in the semiconductor device according to one embodiment of the present invention, the potential of the second gate electrode of the p-channel transistor 304 can be held by the transistor 302 with an extremely low off-state current; therefore, the threshold voltage which is set in accordance with the potential VctlA can be maintained even when a potential is not always supplied to the second gate electrode.

Alternatively, in one embodiment of the present invention, when the threshold voltage of the p-channel transistor 305 is VthpB and the threshold voltage of the n-channel transistor 307 is VthnB, by making the potential VctlB high and the absolute value of the threshold voltage VthpB large, a period where the potential VinB is within the range of VSS+|VthnB|≤VinB≤VDD−|VthpB| can be shortened. That is, the period where the p-channel transistor 305 and the n-channel transistor 307 are turned on at the same time can be shortened. Thus, the through current generated during the period can be reduced.

Furthermore, in the semiconductor device according to one embodiment of the present invention, the potential of the second gate electrode of the p-channel transistor 305 can be held by the transistor 303 with an extremely low off-state current; therefore, the threshold voltage which is set in accordance with the potential VctlB can be maintained even when a potential is not always supplied to the second gate electrode.

Therefore, in the semiconductor device according to one embodiment of the present invention, a through current can be reduced; thus, power consumption can be suppressed. Alternatively, in the semiconductor device according to one embodiment of the present invention, a through current can be reduced; thus, heat generation can be suppressed and reliability of the semiconductor device can be improved.

Figure 10A:
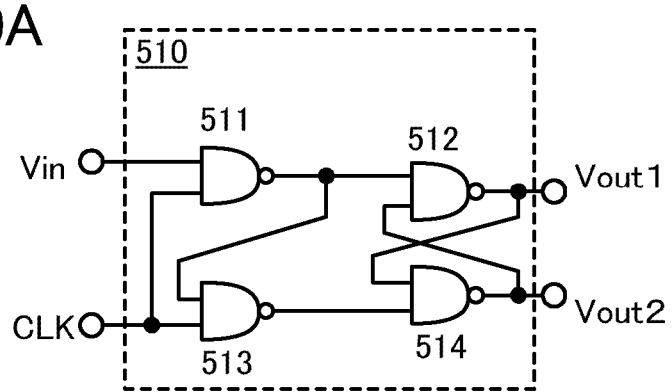
FIG. 10A is a diagram showing an example of the structure of a flip-flop.

Next, FIG. 10A shows an example of the structure of a flip-flop including the NAND in FIG. 6A.

A flip-flop 510 in FIG. 10A is a D-type flip-flop including a NAND 511, a NAND 512, a NAND 513, and a NAND 514. The NAND 511, the NAND 512, the NAND 513, and the NAND 514 each have a structure similar to that of the logic circuit 300 in FIG. 6A.

Specifically, a potential Vin of an input signal is supplied to a first input terminal of the NAND 511. A potential CLK of a clock signal is supplied to a second input terminal of the NAND 511 and a second input terminal of the NAND 513. An output terminal of the NAND 511 is connected to a first input terminal of the NAND 513 and a first input terminal of the NAND 512. An output terminal of the NAND 513 is connected to a second input terminal of the NAND 514. An output terminal of the NAND 512 is connected to a first input terminal of the NAND 514, and the potential of the output terminal of the NAND 512 is supplied, as a potential Vout1 of a first output signal, to a circuit of a subsequent stage. An output terminal of the NAND 514 is connected to a second input terminal of the NAND 512, and the potential of the output terminal of the NAND 514 is supplied, as a potential Vout2 of a second output signal, to the circuit of the subsequent stage.

Note that the flip-flop 510 in FIG. 10A has a structure in which the first output signal and the second output signal can be obtained; however, the number of output signals may be one as needed.

Figure 10B:
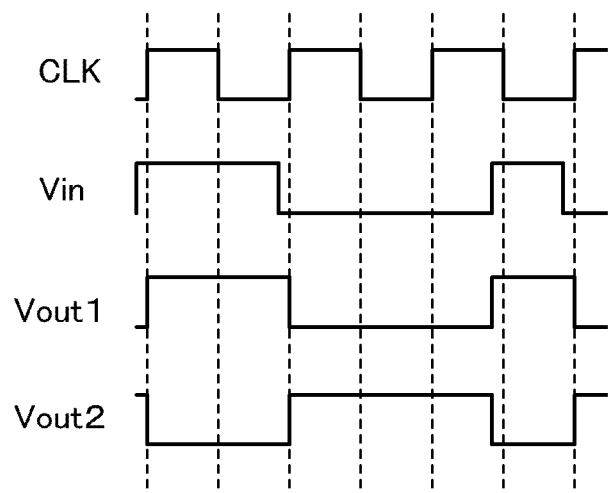
FIG. 10B is a timing chart thereof.

FIG. 10B shows a timing chart of the potential CLK of the clock signal, the potential Vin of the input signal, the potential Vout1 of the first output signal, and the potential Vout2 of the second output signal in the flip-flop 510 in FIG. 10A.

In FIG. 10B, when the potential CLK of the clock signal is at a high level and the potential Vin of the input signal is at a high level, the potential Vout1 of the first output signal is at a high level and the potential Vout2 of the second output signal is at a low level. In addition, when the potential CLK of the clock signal is at a high level and the potential Vin of the input signal is at a low level, the potential Vout1 of the first output signal is at a low level and the potential Vout2 of the second output signal is at a high level. Further, when the potential CLK of the clock signal is at a low level, the potential Vout1 of the first output signal and the potential Vout2 of the second output signal are held despite the potential Vin of the input signal.

This embodiment can be implemented in combination with any of the above embodiments.

Embodiment 4

In this embodiment, another example of the structure of a logic circuit which is used in a semiconductor device according to one embodiment of the present invention will be shown.

Figure 7A:
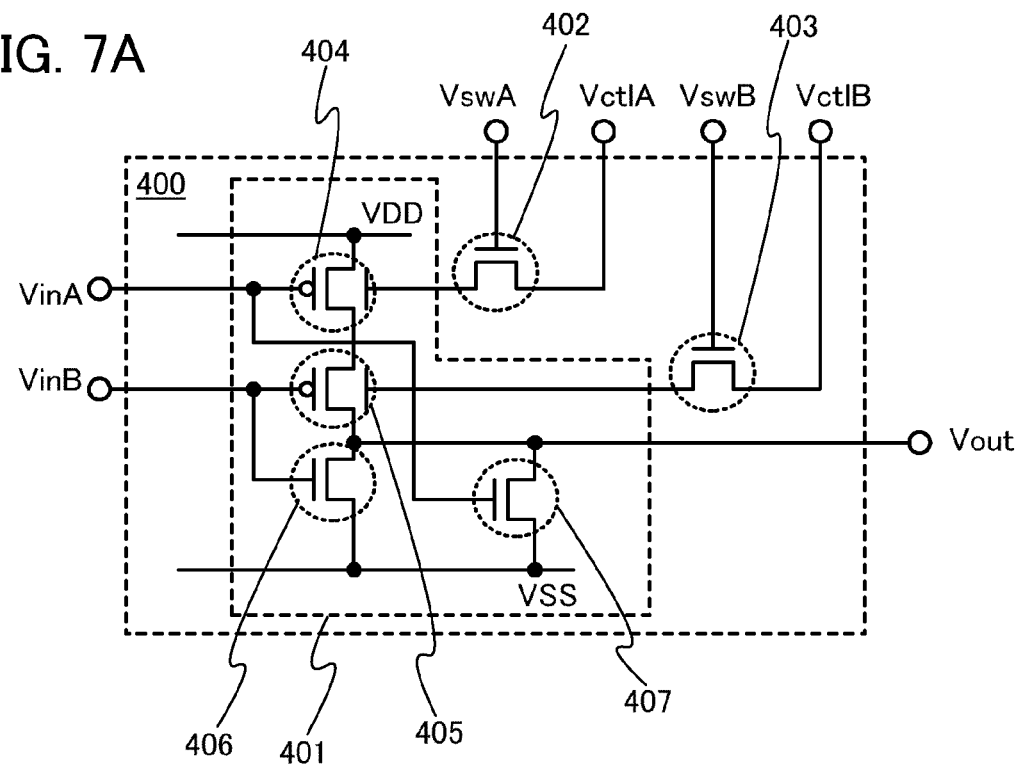
FIG. 7A is a diagram showing an example of the structure of a NOR.

A logic circuit 400 in FIG. 7A includes a logic portion 401 for performing logical operation and a transistor 402 and a transistor 403 with a low off-state current, which each function as a switching element. The logic portion 401 includes a p-channel transistor 404, a p-channel transistor 405, an n-channel transistor 406, and an n-channel transistor 407. FIG. 7A shows, as an example, the case where the logic portion 401 is a NOR including the p-channel transistor 404, the p-channel transistor 405, the n-channel transistor 406, and the n-channel transistor 407.

Specifically, in the logic portion 401, a gate electrode of the p-channel transistor 404 and a gate electrode of the n-channel transistor 407 are connected to each other. A potential VinA of an input signal inputted into the logic circuit 400 is supplied to the gate electrode of the p-channel transistor 404 and the gate electrode of the n-channel transistor 407. In addition, a gate electrode of the p-channel transistor 405 and a gate electrode of the n-channel transistor 406 are connected to each other. A potential VinB of an input signal inputted into the logic circuit 400 is supplied to the gate electrode of the p-channel transistor 405 and the gate electrode of the n-channel transistor 406.

Further, a first terminal of the p-channel transistor 404 is connected to a first node to which a high-level potential VDD is supplied. A second terminal of the p-channel transistor 404 is connected to a first terminal of the p-channel transistor 405. A first terminal of the n-channel transistor 406 and a first terminal of the n-channel transistor 407 are connected to a second node to which a low-level potential VSS is supplied. A second terminal of the p-channel transistor 405, a second terminal of the n-channel transistor 406, and a second terminal of the n-channel transistor 407 are connected to one another, and the potential of a node thereof is outputted as a potential Vout of an output signal.

That is, in the logic portion 401, the p-channel transistor 404 and the n-channel transistor 407 to which the input signal having one logical value is supplied are connected to each other in series between the first node to which the high-level potential VDD is supplied and the second node to which the low-level potential VSS is supplied. In addition, in the logic portion 401, the p-channel transistor 405 and the n-channel transistor 406 to which the input signal having another logical value is supplied are connected to each other in series between the first node to which the high-level potential VDD is supplied and the second node to which the low-level potential VSS is supplied.

In FIG. 7A, the p-channel transistor 404 and the p-channel transistor 405 are each provided with a second gate electrode for controlling a threshold voltage, in addition to a normal gate electrode.

Although FIG. 7A shows, as an example, the case where the p-channel transistor 404 and the p-channel transistor 405 are each provided with the second gate electrode, one embodiment of the present invention is not limited to this structure. Since the p-channel transistor 404 and the p-channel transistor 405 are connected to each other in series in FIG. 7A, a through current can be reduced even when only one of the transistors is provided with the second gate electrode. However, it is preferable that each of the p-channel transistor 404 and the p-channel transistor 405 be provided with the second gate electrode because a through current can be further reduced.

Alternatively, in one embodiment of the present invention, the n-channel transistor 407 may be provided with a second gate electrode instead of the p-channel transistor 404, or each of the p-channel transistor 404 and the n-channel transistor 407 may be provided with a second gate electrode. Further alternatively, in one embodiment of the present invention, the n-channel transistor 406 may be provided with a second gate electrode instead of the p-channel transistor 405, or each of the p-channel transistor 405 and the n-channel transistor 406 may be provided with a second gate electrode.

Further, the transistor 402 controls the supply of a potential to the second gate electrode of the p-channel transistor 404. FIG. 7A shows an example in which a first terminal of the transistor 402 is connected to the second gate electrode of the p-channel transistor 404, and a second terminal of the transistor 402 is connected to a node to which a potential VctlA is supplied. Specifically, the potential VctlA is supplied to the second gate electrode of the p-channel transistor 404 through the transistor 402 when the transistor 402 is turned on, and the potential of the second gate electrode is held when the transistor 402 is turned off. Note that the switching of the transistor 402 is controlled by a potential VswA supplied to the gate electrode of the transistor 402.

The transistor 403 controls the supply of a potential to the second gate electrode of the p-channel transistor 405. FIG. 7A shows an example in which a first terminal of the transistor 403 is connected to the second gate electrode of the p-channel transistor 405, and a second terminal of the transistor 403 is connected to a node to which a potential VctlB is supplied. Specifically, the potential VctlB is supplied to the second gate electrode of the p-channel transistor 405 through the transistor 403 when the transistor 403 is turned on, and the potential of the second gate electrode is held when the transistor 403 is turned off. Note that the switching of the transistor 403 is controlled by a potential VswB supplied to the gate electrode of the transistor 403.

Figure 7B:
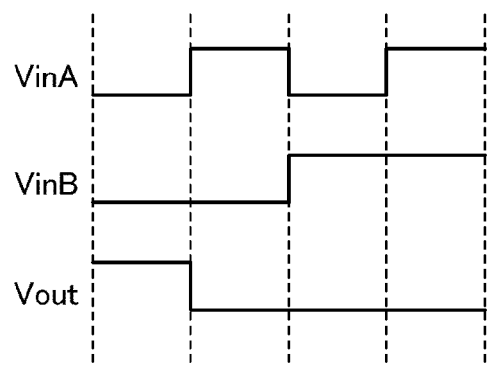
FIG. 7B is a timing chart thereof.

FIG. 7B shows an example of an ideal timing chart of the potentials VinA and VinB of the input signals and the potential Vout of the output signal in the logic circuit 400 in FIG. 7A.

As illustrated in FIG. 7B, when the potential VinA is at a low level and the potential VinB is at a low level, the n-channel transistor 406 and the n-channel transistor 407 are turned off, and the p-channel transistor 404 and the p-channel transistor 405 are turned on. Therefore, the potential VDD is outputted from the logic circuit 400 as the potential Vout of the output signal. In addition, when the potential VinA is at a high level and the potential VinB is at a low level, the p-channel transistor 404 and the n-channel transistor 406 are turned off, and the p-channel transistor 405 and the n-channel transistor 407 are turned on. Therefore, the potential VSS is outputted from the logic circuit 400 as the potential Vout of the output signal. Moreover, when the potential VinA is at a low level and the potential VinB is at a high level, the p-channel transistor 405 and the n-channel transistor 407 are turned off, and the p-channel transistor 404 and the n-channel transistor 406 are turned on. Therefore, the potential VSS is outputted from the logic circuit 400 as the potential Vout of the output signal. Further, when the potential VinA is at a high level and the potential VinB is at a high level, the p-channel transistor 404 and the p-channel transistor 405 are turned off, and the n-channel transistor 406 and the n-channel transistor 407 are turned on. Therefore, the potential VSS is outputted from the logic circuit 400 as the potential Vout of the output signal.

Note that the timing chart in FIG. 7B shows a state of the instantaneous change of the potential VinA and the potential VinB. However, in practice, it slightly takes time until the potential VinA and the potential VinB are completely shifted from a low level to a high level or from a high level to a low level. As described in the above embodiment, a through current flows easily during this period where the potentials shift.

In one embodiment of the present invention, when the threshold voltage of the p-channel transistor 404 is VthpA and the threshold voltage of the n-channel transistor 407 is VthnA, by making the potential VctlA high and the absolute value of the threshold voltage VthpA large, a period where the potential VinA is within the range of VSS+|VthnA|≤VinA≤VDD−|VthpA| can be shortened. That is, the period where the p-channel transistor 404 and the n-channel transistor 407 are turned on at the same time can be shortened. Thus, the through current generated during the period can be reduced.

Furthermore, in the semiconductor device according to one embodiment of the present invention, the potential of the second gate electrode of the p-channel transistor 404 can be held by the transistor 402 with an extremely low off-state current; therefore, the threshold voltage which is set in accordance with the potential VctlA can be maintained even when a potential is not always supplied to the second gate electrode.

Alternatively, in one embodiment of the present invention, when the threshold voltage of the p-channel transistor 405 is VthpB and the threshold voltage of the n-channel transistor 406 is VthnB, by making the potential VctlB high and the absolute value of the threshold voltage VthpB large, a period where the potential VinB is within the range of VSS+|VthnB|≤VinB≤VDD−|VthpB| can be shortened. That is, the period where the p-channel transistor 405 and the n-channel transistor 406 are turned on at the same time can be shortened. Thus, the through current generated during the period can be reduced.

Furthermore, in the semiconductor device according to one embodiment of the present invention, the potential of the second gate electrode of the p-channel transistor 405 can be held by the transistor 403 with an extremely low off-state current; therefore, the threshold voltage which is set in accordance with the potential VctlB can be maintained even when a potential is not always supplied to the second gate electrode.

Therefore, in the semiconductor device according to one embodiment of the present invention, a through current can be reduced; thus, power consumption can be suppressed. Alternatively, in the semiconductor device according to one embodiment of the present invention, a through current can be reduced; thus, heat generation can be suppressed and reliability of the semiconductor device can be improved.

This embodiment can be implemented in combination with any of the above embodiments.

Embodiment 5

In this embodiment, an example of the structure of a semiconductor display device, which is one embodiment of a semiconductor device of the present invention, will be described.

Figure 14:
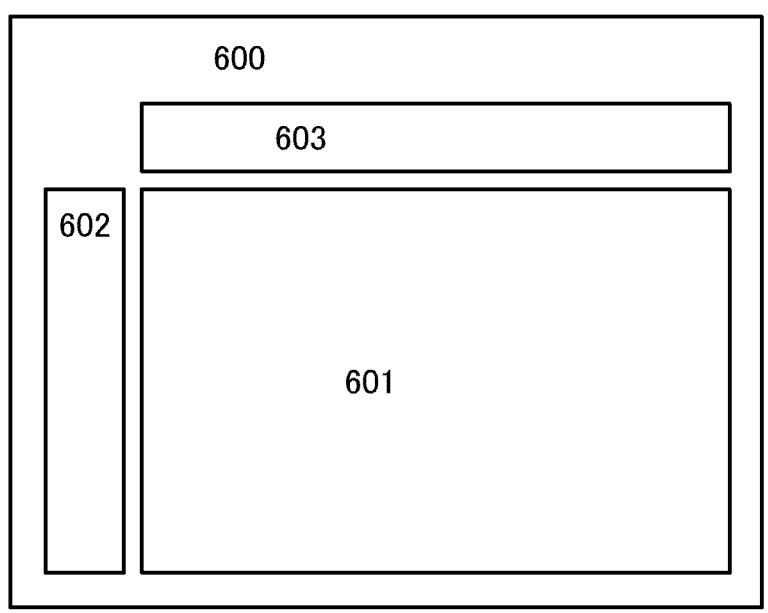
FIG. 14 is a block diagram showing an example of the structure of a semiconductor display device.

FIG. 14 is a block diagram showing an example of the structure of the semiconductor display device according to one embodiment of the present invention. A semiconductor display device 600 in FIG. 14 includes a pixel portion 601 where a display element is provided in each pixel and driver circuits such as a scan line driver circuit 602 and a signal line driver circuit 603 that control the operation of the pixel portion 601.

Specifically, the scan line driver circuit 602 selects pixels included in the pixel portion 601. The signal line driver circuit 603 supplies a video signal to the pixel selected by the scan line driver circuit 602.

Figure 15:
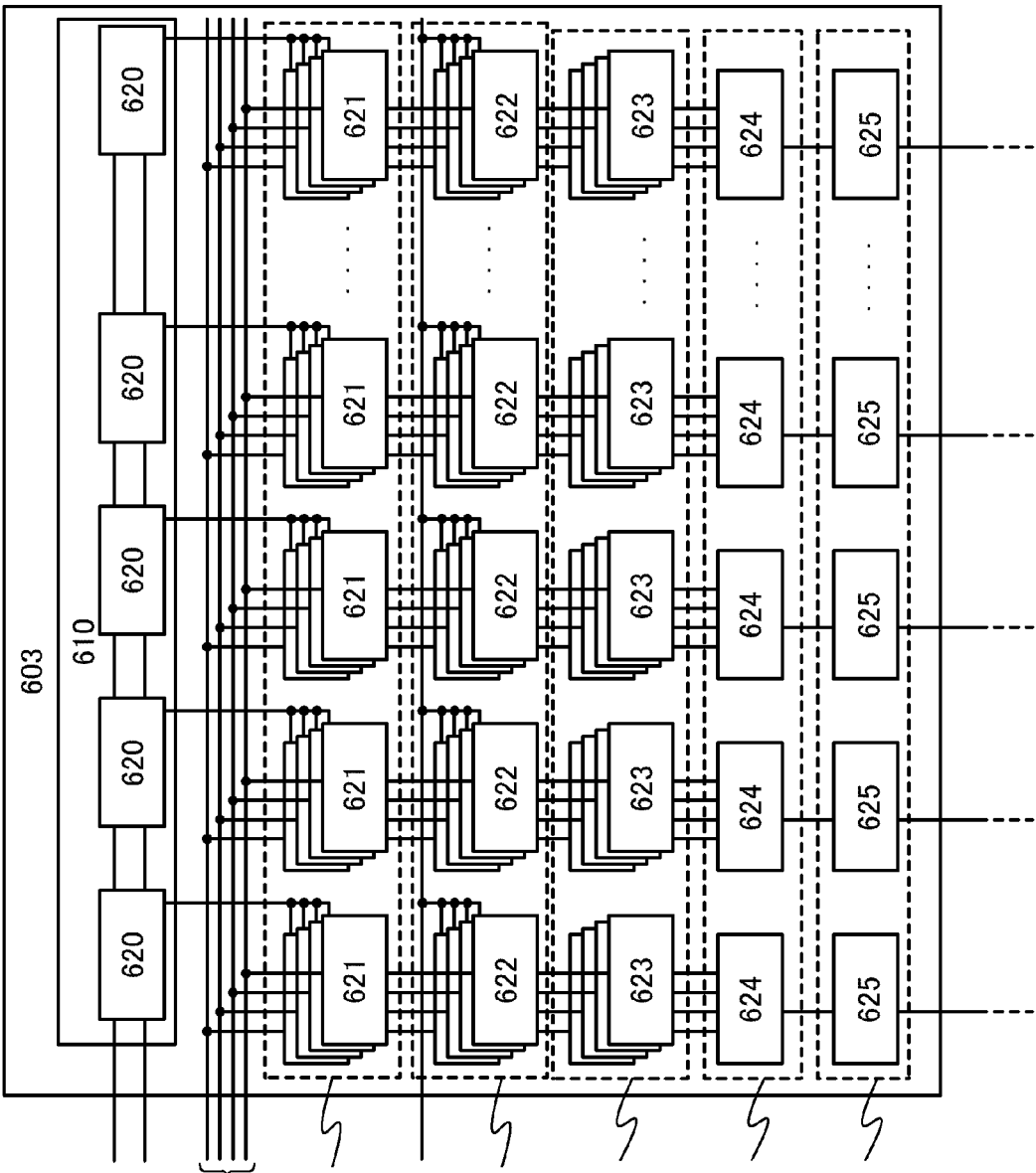
FIG. 15 is a block diagram showing an example of a signal line driver circuit.

Next, FIG. 15 shows an example of a more specific structure of the signal line driver circuit 603. Note that FIG. 15 illustrates the structure of the signal line driver circuit 603 with which a 4-bit video signal is supplied. FIG. 15 shows an example of the structure of the signal line driver circuit 603 corresponding to a 4-bit video signal; however, one embodiment of the present invention is not limited to this structure. The signal line driver circuit can be formed in accordance with the number of bits of a video signal set by a practitioner.

The signal line driver circuit 603 in FIG. 15 includes a shift register 610, a first memory circuit 611, a second memory circuit 612, a level shifter 613, a DAC 614, and a buffer 615.

Further, in the signal line driver circuit 603 in FIG. 15, the shift register 610 includes a plurality of flip-flops 620 corresponding to each signal line. For example, the structure in FIG. 10A can be employed for each flip-flop.

In the signal line driver circuit 603 in FIG. 15, the first memory circuit 611 includes a plurality of memory element groups each having four memory elements 621 each corresponding to the 4-bit video signal. The second memory circuit 612 includes a plurality of memory element groups each having four memory elements 622 each corresponding to the four-bit video signal. The video signal outputted from the second memory circuit 612 is supplied to the level shifter 613. The level shifter 613 includes a plurality of level shifter groups each having four level shifters 623 each corresponding to the four-bit video signal. The DAC 614 includes a plurality of DACs 624 each corresponding to the 4-bit video signal. The buffer 615 includes a plurality of buffers 625, and at least one of the buffers 625 corresponds to one DAC 624.

Next, operation of the semiconductor display device 600 in FIG. 15 will be described. In the signal line driver circuit 603, a clock signal and a start pulse signal are inputted into the shift register 610. The shift register 610 generates a timing signal, a pulse of which is sequentially shifted, in response to the clock signal and the start pulse signal, and outputs the timing signal to the first memory circuit 611. The order of the appearance of the pulse of the timing signal can also be switched in accordance with a signal for switching a scan direction.

When the timing signal is inputted into the first memory circuit 611, a video signal is sampled in accordance with the pulse of the timing signal, and is sequentially written into the memory elements 621 of the first memory circuit 611. That is, the video signal which is serially inputted into the signal line driver circuit 603 is written in parallel into the first memory circuit 611. The video signal written into the first memory circuit 611 is held.

The video signals may be sequentially written into the plurality of memory elements 621 included in the first memory circuit 611; alternatively, a so-called division driving may be performed in which the plurality of memory elements 621 included in the first memory circuit 611 is divided into some groups, and the video signals are inputted into each group in parallel. Note that the number of groups in this case is referred to as the number of divisions. For example, in the case where the memory elements are divided into groups such that each group has four memory elements 621, division driving is performed with four divisions.

The time until the completion of writing of the video signal into the first memory circuit 611 is referred to as a line period.

When one line period is completed, in a retrace period, the video signal held in the first memory circuit 611 is written into the second memory circuit 612 all at once and held in accordance with a pulse of a latch signal inputted into the second memory circuit 612. A video signal for the next line period is sequentially written into the first memory circuit 611 which has finished transmitting the video signal to the second memory circuit 612, in response to a timing signal from the shift register 610. In the second round of the one line period, the video signals written into and held in the second memory circuit 612 are supplied to the level shifter 613.

The voltage amplitude of the video signals supplied to the level shifter 613 is increased in each of the plurality of level shifters 623 in the level shifter 613, and then transmitted to the DAC 614. In the DAC 614, the inputted video signal is converted from a digital signal to an analog signal in each of the plurality of DACs 624. Then, the analog video signal is transmitted to the buffer 615. The video signal transmitted from the DAC 614 is transmitted from each of the plurality of buffers 625 included in the buffer 615 to the pixel portion 601 through a signal line.

The scan line driver circuit 602 selects pixels included in the pixel portion 601 for each line. The video signal transmitted to the pixel portion 601 through the signal line is inputted into pixels in a line selected by the scan line driver circuit 602.

The scan line driver circuit and the signal line driver circuit need to operate at high speed owing to an increase in the number of pixels. In particular, the video signals are inputted into all the pixels connected to one scan line in a period where the scan line is selected; therefore, the signal line driver circuit needs to operate at higher speed than the scan line driver circuit. In the semiconductor device according to one embodiment of the present invention, since a through current can be reduced, heat generation due to a through current can be suppressed and reliability of the semiconductor device can be improved even when a circuit having a high driving frequency is used as in the case of the signal line driver circuit 603.

Further, heat generation due to a through current can be efficiently suppressed by application of one embodiment of the present invention to a semiconductor device including a circuit having a high driving frequency such as a clock generation circuit, a step-up circuit, a decoder which is used for a memory circuit, or a refresh circuit of a DRAM, without limitation to the signal line driver circuit.

This embodiment can be implemented in combination with any of the above embodiments.

Embodiment 6

In this embodiment, a manufacturing method of a semiconductor device according to one embodiment of the present invention, which includes a transistor including silicon and a transistor including an oxide semiconductor, will be described.

Note that the transistors which form a logic portion can be formed using a normal CMOS process in which germanium, silicon, silicon germanium, single crystal silicon carbide, or the like is used. For example, the transistor including silicon can be formed using a silicon wafer, a silicon thin film which is formed by an SOI method, a silicon thin film which is formed by a vapor deposition method, or the like.

Note that in this embodiment, the manufacturing method of the transistor including an oxide semiconductor is described by giving the logic circuit in FIG. 2A as an example; however, a logic circuit having another circuit structure can also be formed by referring to the manufacturing method described in this embodiment.

Figure 11A:
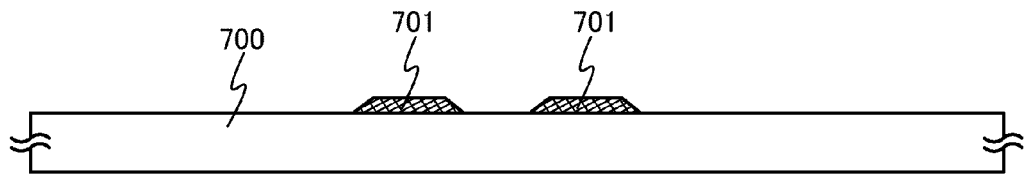
FIGS. 11A to 11E are cross-sectional views showing an example of a manufacturing method of a semiconductor device.

First, as illustrated in FIG. 11A, a gate electrode 701 is formed over an insulating surface of a substrate 700. The gate electrode 701 functions as a second gate electrode of a p-channel transistor 705 which will be formed later.

Although there is no particular limitation on a substrate which can be used as the substrate 700, it is necessary that the substrate have at least enough heat resistance to heat treatment performed later. For example, a glass substrate manufactured by a fusion method or a float method, a quartz substrate, a ceramic substrate, or the like can be used as the substrate 700. When the temperature of the heat treatment performed later is high, it is preferable to use a substrate having a strain point of 730° C. or higher as the glass substrate. Further, a metal substrate such as a stainless-steel substrate or a substrate in which an insulating film is formed on the surface of a silicon substrate may be used as well. There is a tendency that a flexible substrate formed using a synthetic resin such as plastics has a lower upper temperature limit than the above substrates; however, such a substrate can be used as long as it can withstand processing temperature in manufacturing steps.

The gate electrode 701 can be formed to have a single-layer structure or a stacked-layer structure using one or more conductive films including a metal material such as molybdenum, titanium, chromium, tantalum, tungsten, neodymium, or scandium or an alloy material which contains any of these metal materials as a main component, or a nitride of any of these metals. Note that aluminum or copper can also be used as such metal materials if aluminum or copper can withstand a temperature of heat treatment performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, as a two-layer stacked structure of the gate electrode 701, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 701, the following structure is preferable: a stacked structure containing an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, an alloy of indium oxide and tin oxide, an alloy of indium oxide and zinc oxide, zinc oxide, zinc aluminum oxide, zinc aluminum oxynitride, zinc gallium oxide, or the like can also be used as the gate electrode 701.

The thickness of the gate electrode 701 is in the range of 10 nm to 400 nm, preferably 100 nm to 200 nm. In this embodiment, after the conductive film for the gate electrode is formed to have a thickness of 150 nm by a sputtering method using a tungsten target, the conductive film is processed (patterned) into a desired shape by etching, whereby the gate electrode 701 is formed. Note that when end portions of the formed gate electrode are tapered, coverage with a gate insulating film stacked thereover is improved, which is preferable. Note that a resist mask may be formed by an ink-jet method. Formation of the resist mask by an ink-jet method needs no photomask; thus, manufacturing cost can be reduced.

Figure 11B:
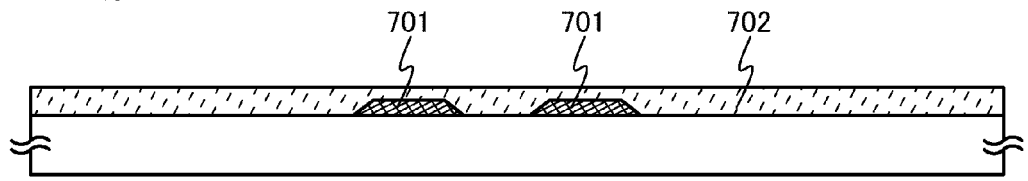

Next, as illustrated in FIG. 11B, an insulating film 702 is formed so as to cover the gate electrode 701. In this embodiment, two insulating films are stacked to form the insulating film 702. A silicon oxynitride film, which is formed with a thickness of 10 nm to 50 nm, is used as the insulating film formed first. A silicon oxide film or a silicon oxynitride film, which is formed with a thickness of 0.5 μm to 1 μm, is used as the insulating film formed next. Note that the structure of the insulating film 702 is not limited thereto. The insulating film may be a single layer or three or more layers. The material is not limited to the above either.

Figure 11C:
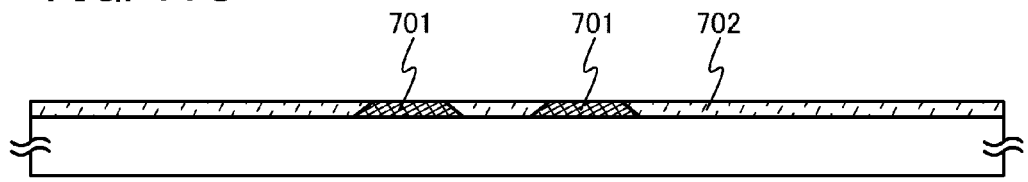

In some cases, the surface of the insulating film 702 has unevenness caused by the gate electrode 701 which is formed first. In this case, it is preferable to provide a step of planarizing the unevenness. In this embodiment, the planarization is performed by CMP. For an abrasive (slurry) of CMP used for the insulating film 702, for example, fumed silica particles which are obtained by pyrolysis of a silicon chloride gas and which are dispersed in an aqueous solution to which KOH is added is preferably used. In this embodiment, as illustrated in FIG. 11C, the insulating film 702 is thinned by CMP to the extent that the gate electrode 701 is exposed and the surface is planarized.

Figure 11D:
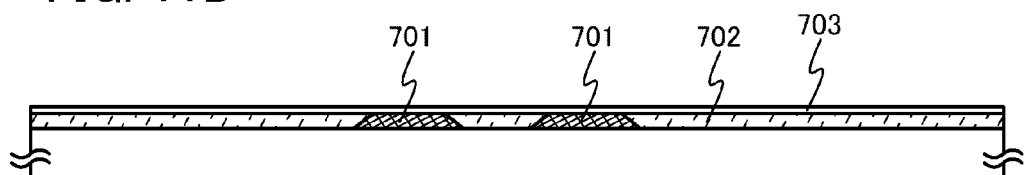

Next, as illustrated in FIG. 11D, an insulating film 703 is formed so as to cover the gate electrode 701 and the insulating film 702, the surface of which is removed. The insulating film 703 can be formed to have a single-layer structure or a stacked-layer structure using one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film.

In this specification, an oxynitride refers to a substance which includes more oxygen than nitrogen, and a nitride oxide refers to a substance which includes more nitrogen than oxygen.

Note that although the insulating film 702 is thinned to the extent that the gate electrode 701 is exposed in this embodiment, one embodiment of the present invention is not limited to this structure. In a portion where the insulating film 702 overlaps with the gate electrode 701, the insulating film 702 may have a thickness to some extent. Note that in this case, it is not necessary to form the insulating film 703.

Figure 11E:
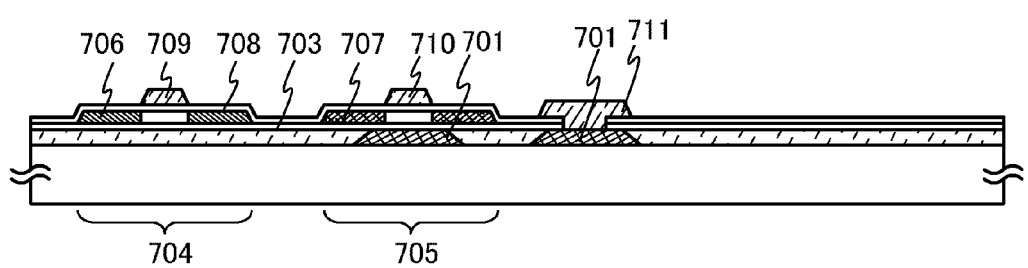

Next, as illustrated in FIG. 11E, an n-channel transistor 704 and the p-channel transistor 705 are formed by a known CMOS manufacturing method. In this embodiment, the case where the n-channel transistor 704 and the p-channel transistor 705 are formed with a single crystal semiconductor film which is separated from a single crystal semiconductor substrate is given as an example.

Specifically, an example of a manufacturing method of the single crystal semiconductor film will be briefly described.

First, an ion beam including ions which are accelerated by an electric field enters the single crystal semiconductor substrate and a fragile layer which is weakened by local disorder of the crystal structure is formed in a region at a certain depth from the surface of the semiconductor substrate. The depth at which the fragile layer is formed can be adjusted by the acceleration energy of the ion beam and the angle at which the ion beam enters. Then, the semiconductor substrate and the substrate 700 are attached to each other so that the gate electrode 701, the insulating film 702, and the insulating film 703 are provided therebetween. After the semiconductor substrate and the substrate 700 are overlapped with each other, a pressure of, approximately, greater than or equal to 1 N/cm$^2$ and less than or equal to 500 N/cm$^2$, preferably greater than or equal to 11 N/cm$^2$ and less than or equal to 20 N/cm$^2$ is applied to part of the semiconductor substrate and the substrate 700 to attach both the substrates. When the pressure is applied, bonding between the semiconductor substrate and the insulating film 703 starts from the portion, which results in bonding of the entire surface where the semiconductor substrate and the insulating film 703 are in close contact with each other. Subsequently, heat treatment is performed, whereby very small voids that exist in the fragile layer are combined, so that the very small voids increase in volume. As a result, the single crystal semiconductor film which is part of the semiconductor substrate is separated from the semiconductor substrate along the fragile layer. The heat treatment is performed at a temperature not exceeding the strain point of the substrate 700. Then, the single crystal semiconductor film is processed into a desired shape by etching or the like, so that an island-shaped semiconductor film 706 and an island-shaped semiconductor film 707 can be formed.

The n-channel transistor 704 is formed using the island-shaped semiconductor film 706 over the insulating film 703, and the p-channel transistor 705 is formed using the island-shaped 707 over the insulating film 703. In addition, the n-channel transistor 704 includes a gate electrode 709, and the p-channel transistor 705 includes a gate electrode 710. The n-channel transistor 704 includes an insulating film 708 between the island-shaped semiconductor film 706 and the gate electrode 709. The p-channel transistor 705 includes the insulating film 708 between the island-shaped semiconductor film 707 and the gate electrode 710.

Note that although the case where the n-channel transistor 704 and the p-channel transistor 705 are formed using the single crystal semiconductor film is shown as an example in this embodiment, the present invention is not limited to this structure. For example, a polycrystalline or microcrystalline semiconductor film which is formed over the insulating film 703 by a vapor deposition method may be used. Alternatively, the above semiconductor film may be formed by being crystallized by a known technique. As the known technique of crystallization, a laser crystallization method using a laser beam and a crystallization method using a catalytic element are given. Alternatively, a crystallization method using a catalytic element and a laser crystallization method may be combined. When a heat-resistant substrate such as a quartz substrate is used, any one of a thermal crystallization method using an electrically heated furnace, a lamp annealing crystallization method using infrared light, a crystallization method using a catalytic element, a high-temperature annealing method at approximately 950° C., or a crystallization method combined with a plurality thereof may be used.

In addition, in FIG. 11E, a contact hole reaching the gate electrode 701 is formed in the insulating film 703 and the insulating film 708 before a conductive film for forming the gate electrode 709 and the gate electrode 710 is formed. Then, after the conductive film is formed over the insulating film 708 so as to cover the contact hole, the conductive film is processed into a desired shape by etching or the like, whereby a wiring 711 connected to the gate electrode 701 is formed together with the gate electrode 709 and the gate electrode 710.

Figure 12A:
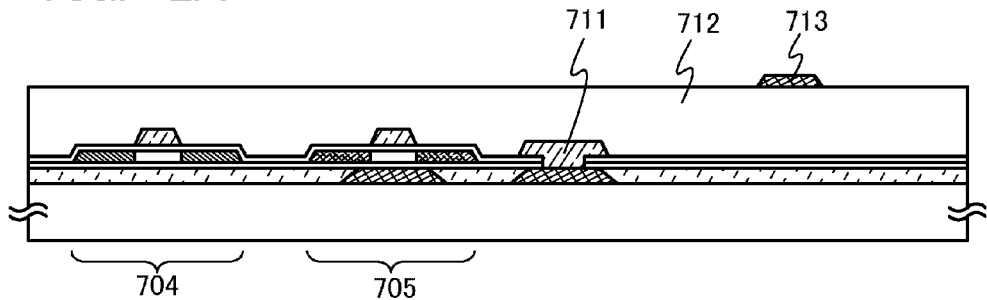
FIGS. 12A to 12D are cross-sectional views showing an example of a manufacturing method of a semiconductor device.

Next, as illustrated in FIG. 12A, an insulating film 712 is formed so as to cover the n-channel transistor 704, the p-channel transistor 705, and the wiring 711. Note that although the case where the insulating film 712 is formed in a single layer is shown as an example in this embodiment, the insulating film 712 is not necessarily a single layer and insulating films of two or more layers may be stacked as the insulating film 712.

The insulating film 712 is formed using materials which can withstand a temperature of heat treatment in a later manufacturing step. Specifically, it is preferable to use silicon oxide, silicon nitride, silicon nitride oxide, silicon oxynitride, aluminum nitride, aluminum oxide, or the like for the insulating film 712.

The insulating film 712 may have its surface planarized by a CMP method or the like.

Next, as illustrated in FIG. 12A, a gate electrode 713 is formed over the insulating film 712.

The gate electrode 713 can be formed to have a single-layer structure or a stacked-layer structure using one or more conductive films including a metal material such as molybdenum, titanium, chromium, tantalum, tungsten, neodymium, or scandium or an alloy material which contains any of these metal materials as a main component, or a nitride of any of these metals. Note that aluminum or copper can also be used as such metal materials if aluminum or copper can withstand a temperature of heat treatment performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, as a two-layer stacked structure of the gate electrode 713, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 713, the following structure is preferable: a stacked structure containing an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, an alloy of indium oxide and tin oxide, an alloy of indium oxide and zinc oxide, zinc oxide, zinc aluminum oxide, zinc aluminum oxynitride, zinc gallium oxide, or the like can also be used as the gate electrode 713.

The thickness of the gate electrode 713 is in the range of 10 nm to 400 nm, preferably 100 nm to 200 nm. In this embodiment, after the conductive film for the gate electrode is formed to have a thickness of 150 nm by a sputtering method using a tungsten target, the conductive film is processed (patterned) into a desired shape by etching, whereby the gate electrode 713 is formed. Note that when end portions of the formed gate electrode are tapered, coverage with a gate insulating film stacked thereover is improved, which is preferable.

Note that a resist mask may be formed by an ink-jet method. Formation of the resist mask by an ink-jet method needs no photomask; thus, manufacturing cost can be reduced.

Next, a gate insulating film 714 is formed over the gate electrode 713. The gate insulating film 714 can be formed to have a single-layer structure or a stacked-layer structure using one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film by a plasma CVD method, a sputtering method, or the like. It is preferable that the gate insulating film 714 contains as little impurities such as moisture, hydrogen, or oxygen as possible. In the case where a silicon oxide film is formed by a sputtering method, a silicon target or a quartz target is used as a target, and oxygen or a mixed gas of oxygen and argon is used as a sputtering gas.

An oxide semiconductor that is made to be an intrinsic oxide semiconductor or a substantially intrinsic oxide semiconductor (the oxide semiconductor that is highly purified) by removal of impurities is extremely sensitive to an interface state and an interface electric charge; thus, an interface between the highly purified oxide semiconductor and the gate insulating film 714 is important. Therefore, the gate insulating film (GI) that is in contact with the highly purified oxide semiconductor needs to have higher quality.

For example, high-density plasma CVD using microwaves (e.g., a frequency of 2.45 GHz) is preferable because a dense high-quality insulating film having high withstand voltage can be formed. This is because when the highly purified oxide semiconductor is closely in contact with the high-quality gate insulating film, the interface state can be reduced and favorable interface characteristics can be obtained.

Needless to say, a different film formation method such as a sputtering method or a plasma CVD method can be used as long as a high-quality insulating film can be formed as a gate insulating film. Moreover, it is possible to form an insulating film whose quality and characteristics of an interface with the oxide semiconductor are improved through heat treatment performed after the formation of the insulating film. In any case, an insulating film that has favorable film quality as the gate insulating film and can reduce interface state density with the oxide semiconductor to form a favorable interface is formed.

The gate insulating film 714 may be formed to have a structure in which an insulating film formed using a material having a high barrier property and an insulating film having lower proportion of nitrogen, such as a silicon oxide film or a silicon oxynitride film, are stacked. In this case, the insulating film such as a silicon oxide film or a silicon oxynitride film is formed between the insulating film having a high barrier property and the oxide semiconductor film. As the insulating film having a high barrier property, a silicon nitride film, a silicon nitride oxide film, an aluminum nitride film, an aluminum nitride oxide film, or the like can be given, for example. The insulating film having a high barrier property is used, so that impurities in an atmosphere, such as moisture or hydrogen, or impurities in the substrate, such as an alkali metal or a heavy metal, can be prevented from entering the oxide semiconductor film, the gate insulating film 714, or the interface between the oxide semiconductor film and another insulating film and the vicinity thereof. In addition, the insulating film having lower proportion of nitrogen, such as a silicon oxide film or a silicon oxynitride film, is formed so as to be in contact with the oxide semiconductor film, so that the insulating film having a high barrier property can be prevented from being in direct contact with the oxide semiconductor film.

For example, a silicon nitride film ($SiN_y$ ($y>0$)) with a thickness of greater than or equal to 50 nm and less than or equal to 200 nm is formed by a sputtering method as a first gate insulating film, and a silicon oxide film ($SiO_x$ ($x>0$)) with a thickness of greater than or equal to 5 nm and less than or equal to 300 nm is stacked over the first gate insulating film as a second gate insulating film; thus, these films may be used as the gate insulating film 714 having a thickness of 100 nm. The thickness of the gate insulating film 714 may be set as appropriate depending on characteristics needed for the transistors and may be approximately 350 nm to 400 nm.

In this embodiment, the gate insulating film 714 having a structure in which a silicon oxide film having a thickness of 100 nm formed by a sputtering method is stacked over a silicon nitride film having a thickness of 50 nm formed by a sputtering method is formed.

Note that the gate insulating film is in contact with the oxide semiconductor layer to be formed later. When hydrogen is contained in the oxide semiconductor, characteristics of the transistor are adversely affected; therefore, it is preferable that the gate insulating film do not contain hydrogen, hydroxyl, and moisture. In order that the gate insulating film 714 contains as little hydrogen, hydroxyl, and moisture as possible, it is preferable that an impurity adsorbed on the substrate 700, such as moisture or hydrogen, be eliminated and removed by preheating the substrate 700, over which the gate electrode 713 is formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can be omitted.

Next, over the gate insulating film 714, an oxide semiconductor film having a thickness of greater than or equal to 2 nm and less than or equal to 200 nm, preferably greater than or equal to 3 nm and less than or equal to 50 nm, or more preferably greater than or equal to 3 nm and less than or equal to 20 nm is formed. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is formed by a sputtering method, dust attached to a surface of the gate insulating film 714 is preferably removed by reverse sputtering in which an argon gas is introduced and plasma is generated. The reverse sputtering refers to a method in which, without application of voltage to a target side, an RF power source is used for application of voltage to a substrate side under an argon atmosphere to generate plasma in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

As described above, examples of the oxide semiconductor film include a quaternary metal oxide such as an In—Sn—Ga—Zn—O-based oxide semiconductor; ternary metal oxides such as an In—Ga—Zn—O-based oxide semiconductor, an In—Sn—Zn—O-based oxide semiconductor, an In—Al—Zn—O-based oxide semiconductor, an Sn—Ga—Zn—O-based oxide semiconductor, an Al—Ga—Zn—O-based oxide semiconductor, and an Sn—Al—Zn—O-based oxide semiconductor; binary metal oxides such as an In—Zn—O-based oxide semiconductor, an Sn—Zn—O-based oxide semiconductor, an Al—Zn—O-based oxide semiconductor, a Zn—Mg—O-based oxide semiconductor, an Sn—Mg—O-based oxide semiconductor, an In—Mg—O-based oxide semiconductor, and an In—Ga—O-based oxide semiconductor; an In—O-based oxide semiconductor; an Sn—O-based oxide semiconductor; and a Zn—O-based oxide semiconductor.

In this embodiment, as the oxide semiconductor film, an In—Ga—Zn—O-based oxide semiconductor thin film with a thickness of 30 nm, which is obtained by a sputtering method using a target including indium (In), gallium (Ga), and zinc (Zn), is used. As the above target, a target having a composition ratio of, for example, $In_2O_3:Ga_2O_3:ZnO=1:1:1$ [molar ratio] is used. Alternatively, a target having a composition ratio of $In_2O_3:Ga_2O_3:ZnO=1:1:2$ [molar ratio] or a target having a composition ratio of $In_2O_3:Ga_2O_3:ZnO=1:1:4$ [molar ratio] can be used. Further alternatively, the film formation may be performed with the use of a target containing $SiO_2$ at greater than or equal to 2 wt % and less than or equal to 10 wt %. The filling rate of the target including In, Ga, and Zn is greater than or equal to 90% and less than or equal to 100%, preferably greater than or equal to 95% and less than or equal to 99.9%. With the use of the target with high filling rate, a dense oxide semiconductor film is formed.

When an In—Zn—O based material is used as the oxide semiconductor, a target to be used has a composition ratio of In:Zn=50:1 to 1:2 in an atomic ratio ($In_2O_3:ZnO$=25:1 to 1:4 in a molar ratio), preferably In:Zn=20:1 to 1:1 in an atomic ratio ($In_2O_3:ZnO$=10:1 to 2:1 in a molar ratio), or more preferably In:Zn=1.5:1 to 15:1 in an atomic ratio ($In_2O_3:ZnO$=3:4 to 15:2 in a molar ratio). For example, when a target used for forming the In—Zn—O-based oxide semiconductor has a composition ratio of In:Zn:O=X:Y:Z in an atomic ratio, Z>(1.5X+Y) is satisfied. The mobility can be improved by keeping the ratio of Zn within the above range.

In this embodiment, the oxide semiconductor film is formed over the substrate 700 in such a manner that the substrate is held in the treatment chamber kept at reduced pressure, a sputtering gas from which hydrogen and moisture have been removed is introduced into the treatment chamber while residual moisture therein is removed, and the above target is used. The substrate temperature in film formation may be higher than or equal to 100° C. and lower than or equal to 600° C., preferably higher than or equal to 200° C. and lower than or equal to 400° C. By forming the oxide semiconductor film in a state where the substrate is heated, the concentration of impurities included in the formed oxide semiconductor film can be reduced. In addition, damage by sputtering can be reduced. In order to remove residual moisture in the treatment chamber, an entrapment vacuum pump is preferably used. For example, a cryopump, an ion pump, or a titanium sublimation pump is preferably used. The exhaustion unit may be a turbo pump provided with a cold trap. In the film formation chamber which is exhausted with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the film formation chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be made uniform.

In order that the oxide semiconductor film contains as little hydrogen, hydroxyl, and moisture as possible, it is preferable that an impurity adsorbed on the substrate 700, such as moisture or hydrogen, be eliminated and removed by preheating the substrate 700, over which films up to the gate insulating film 714 are formed, in a preheating chamber of a sputtering apparatus, as a pretreatment for film formation. The temperature for the preheating is higher than or equal to 100° C. and lower than or equal to 400° C., preferably higher than or equal to 150° C. and lower than or equal to 300° C. As an exhaustion unit provided in the preheating chamber, a cryopump is preferable. Note that this preheating treatment can also be omitted. This preheating may be similarly performed on the substrate 700 over which layers up to and including an electrode 716, an electrode 717, an electrode 718, an electrode 719, an electrode 720, an electrode 721, and an electrode 722 are formed before the formation of an insulating film 723 which will be formed later.

Figure 12B:
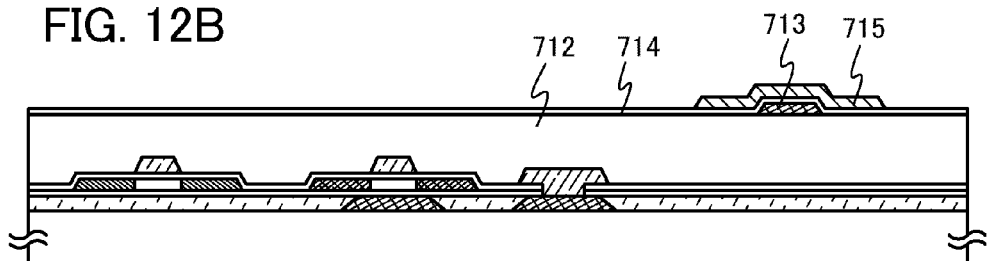

Next, as illustrated in FIG. 12B, the oxide semiconductor film is processed (patterned) into a desired shape by etching or the like, whereby an island-shaped oxide semiconductor film 715 is formed over the gate insulating film 714 in a position where the island-shaped oxide semiconductor film 715 overlaps with the gate electrode 713.

A resist mask for forming the island-shaped oxide semiconductor film 715 may be formed by an ink-jet method. Formation of the resist mask by an ink-jet method needs no photomask; thus, manufacturing cost can be reduced.

Note that etching for forming the island-shaped oxide semiconductor film 715 may be wet etching, dry etching, or both dry etching and wet etching. As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, ITO-07N (produced by KANTO CHEMICAL CO., INC.) may be used. The etchant after the wet etching is removed by cleaning together with the etched materials. The waste liquid including the etchant and the material etched off may be purified and the material may be reused. When a material such as indium included in the oxide semiconductor film is collected from the waste liquid after the etching and reused, the resources can be efficiently used and the cost can be reduced.

Note that it is preferable that reverse sputtering be performed before the formation of a conductive film in a subsequent step so that a resist residue or the like that is attached to surfaces of the island-shaped oxide semiconductor film 715 and the gate insulating film 714 is removed.

Note that, in some cases, the oxide semiconductor film formed by sputtering or the like includes a large amount of moisture or hydrogen as impurities. Moisture and hydrogen easily form a donor level and thus serve as impurities in the oxide semiconductor. Thus, in one embodiment of the present invention, in order to reduce an impurity such as moisture or hydrogen in the oxide semiconductor film, heat treatment is performed on the oxide semiconductor film 715 under a nitrogen atmosphere, an oxygen atmosphere, an atmosphere of ultra-dry air, or a rare gas (e.g., argon and helium) atmosphere. It is preferable that the content of water in the gas be 20 ppm or less, preferably 1 ppm or less, or more preferably 10 ppb or less.

Heat treatment performed on the oxide semiconductor film 715 can eliminate moisture or hydrogen in the oxide semiconductor film 715. Specifically, heat treatment may be performed at a temperature higher than or equal to 300° C. and lower than or equal to 700° C., preferably higher than or equal to 300° C. and lower than or equal to 500° C. For example, heat treatment may be performed at 500° C. for approximately longer than or equal to three minutes and shorter than or equal to six minutes. When an RTA method is used for the heat treatment, dehydration or dehydrogenation can be performed in a short time; therefore, treatment can be performed even at a temperature higher than the strain point of a glass substrate.

In this embodiment, an electrical furnace that is one of heat treatment apparatuses is used.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with an object to be processed by heat treatment, such as nitrogen or a rare gas such as argon, is used.

Note that it is preferable that in the heat treatment, moisture, hydrogen, or the like be not contained in nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or less, preferably 0.1 ppm or less).

Through the above process, the concentration of hydrogen in the oxide semiconductor film 715 can be reduced and the oxide semiconductor film 715 can be highly purified. Thus, the oxide semiconductor film can be stabilized. In addition, heat treatment at a temperature of lower than or equal to the glass transition temperature makes it possible to form an oxide semiconductor film whose band gap is wide and whose carrier density due to hydrogen is low. Therefore, the transistor can be manufactured using a large-sized substrate, so that the productivity can be increased. In addition, by using the highly purified oxide semiconductor film in which the hydrogen concentration is reduced, it is possible to manufacture a transistor with high withstand voltage and a high on-off ratio.

Note that in the case where the oxide semiconductor film is heated, although depending on a material of the oxide semiconductor film or heating conditions, plate-like crystals are formed at the surface of the oxide semiconductor film in some cases. The plate-like crystal is preferably a single crystal which is c-axis-aligned in a direction perpendicular to a surface of the oxide semiconductor film. Even if the plate-like crystals are not single crystal bodies, each crystal is preferably a polycrystalline body which is c-axis-aligned in a direction substantially perpendicular to the surface of the oxide semiconductor film. Further, it is preferable that the polycrystalline bodies be c-axis-aligned and that the a-b planes of crystals correspond, or the a-axis or the b-axis of the crystals be aligned with each other. Note that when a base surface of the oxide semiconductor film is uneven, a plate-like crystal is a polycrystal. Therefore, the surface of the base is preferably as even as possible.

Next, the insulating film 708, the insulating film 712, and the gate insulating film 714 are partly etched, whereby contact holes reaching the island-shaped semiconductor film 706 of the n-channel transistor 704, the island-shaped semiconductor film 707 of the p-channel transistor 705, the gate electrode 709 of the n-channel transistor 704, the gate electrode 710 of the p-channel transistor 705, and the wiring 711 are formed.

Figure 12C:
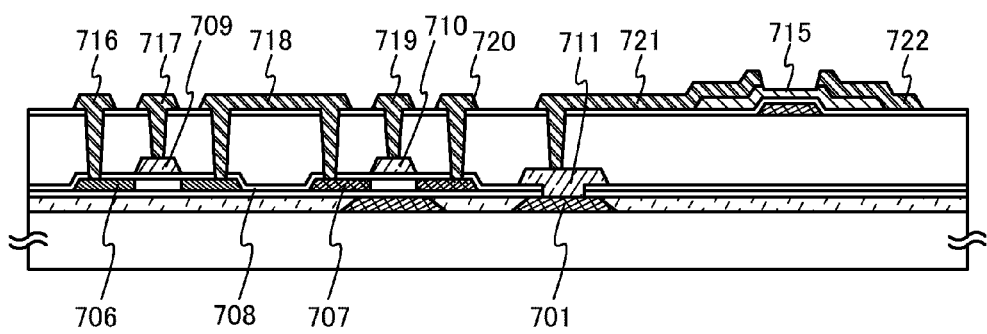

Then, a conductive film is formed so as to cover the oxide semiconductor film 715 by a sputtering method or a vacuum vapor deposition method. After that, the conductive film is patterned by etching or the like, so that the electrodes 716 to 722 which each function as a source electrode, a drain electrode, or a wiring are formed as illustrated in FIG. 12C.

Note that the electrode 716 and the electrode 718 are in contact with the island-shaped semiconductor film 706. The electrode 717 is in contact with the gate electrode 709. The electrode 718 and the electrode 720 are in contact with the island-shaped semiconductor film 707. The electrode 719 is in contact with the gate electrode 710. The electrode 721 is in contact with the wiring 711 and the oxide semiconductor film 715. The electrode 722 is in contact with the oxide semiconductor film 715.

Note that although the case where the electrode 721 and the gate electrode 701 are connected to each other through the wiring 711 is shown as an example in this embodiment, the electrode 721 and the gate electrode 701 may be directly connected to each other in one embodiment of the present invention. However, in this case, it is preferable that the contact hole through which the electrode 721 and the gate electrode 701 are connected to each other be formed in a step different from a step of forming the other contact holes. With the above structure, the island-shaped semiconductor film 707 and the island-shaped semiconductor film 706 can be prevented from being etched at the formation of the contact holes reaching the island-shaped semiconductor film 707 and the island-shaped semiconductor film 706.

As a material of the conductive film for forming the electrodes 716 to 722, an element selected from Al, Cr, Cu, Ta, Ti, Mo, and W; an alloy containing any of these elements as a component; an alloy film containing any of these elements in combination; and the like can be given. In addition, a structure in which a film of a refractory metal such as Cr, Ta, Ti, Mo, or W is formed on a lower side or an upper side of a metal film of Al, Cu, or the like may be used. Further, when an Al material to which an element preventing generation of hillocks and whiskers in an Al film, such as Si, Ti, Ta, W, Mo, Cr, Nd, Sc, or Y, is added is used, heat resistance can be increased.

Further, the conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given.

Alternatively, the conductive film for forming the electrodes 716 to 722 may be formed using conductive metal oxide. As a conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or the metal oxide material to which silicon or silicon oxide is added can be used.

In the case where heat treatment is performed after formation of the conductive film, the conductive film preferably has heat resistance enough to withstand the heat treatment.

Note that each material and etching conditions are adjusted as appropriate so that the oxide semiconductor film 715 is not removed in etching of the conductive film as much as possible. Depending on etching conditions, an exposed portion of the island-shaped oxide semiconductor film 715 may be partly etched, so that a groove (a recessed portion) is formed in some cases.

In this embodiment, a titanium film is used for the conductive film. Therefore, wet etching can be selectively performed on the conductive film using a solution (ammonia hydrogen peroxide mixture) containing ammonia and hydrogen peroxide water; however, the oxide semiconductor film 715 is partly etched in some cases. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron trichloride ($BCl_3$), or the like.

In order to reduce the number of photomasks and steps in a photolithography step, etching may be performed with the use of a resist mask formed using a multi-tone mask which is a light-exposure mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can also be reduced, whereby simplification of a process can be realized.

Next, plasma treatment is performed using a gas such as $N_2O$, $N_2$, or Ar. By the plasma treatment, water or the like which attaches or is adsorbed to an exposed surface of the oxide semiconductor film is removed. Plasma treatment may be performed using a mixed gas of oxygen and argon as well.

Figure 12D:
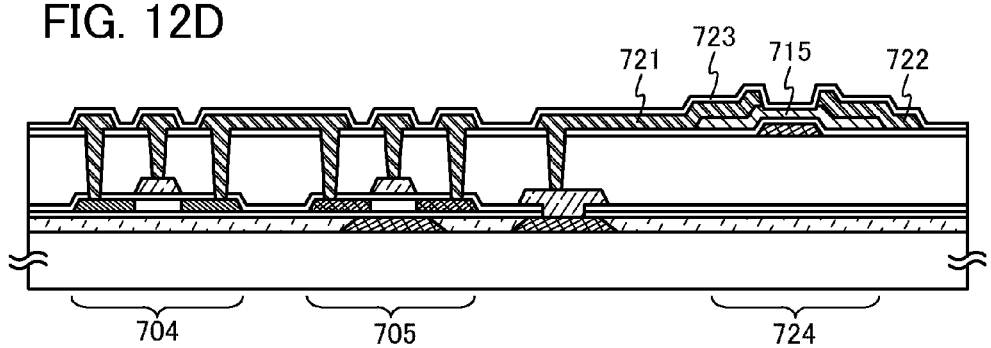

After the plasma treatment, as illustrated in FIG. 12D, the insulating film 723 is formed so as to cover the electrodes 716 to 722 and the oxide semiconductor film 715. The insulating film 723 preferably contains as little impurities such as moisture, hydrogen, and oxygen as possible. An insulating film of a single layer or a plurality of insulating films stacked may be employed for the insulating film 723. When hydrogen is contained in the insulating film 723, entry of the hydrogen to the oxide semiconductor film or extraction of oxygen in the oxide semiconductor film by the hydrogen occurs, whereby a back channel portion of the oxide semiconductor film has lower resistance (n-type conductivity); thus, a parasitic channel might be formed. Therefore, it is important that a film formation method in which hydrogen is not used be employed in order to form the insulating film 723 containing as little hydrogen as possible. A material having a high barrier property is preferably used for the insulating film 723. As the insulating film having a high barrier property, a silicon nitride film, a silicon nitride oxide film, an aluminum nitride film, an aluminum nitride oxide film, or the like can be used, for example. When a plurality of insulating films stacked is used, an insulating film having lower proportion of nitrogen, such as a silicon oxide film or a silicon oxynitride film, is formed on the side closer to the oxide semiconductor film 715 than the insulating film having a high barrier property. Then, the insulating film having a high barrier property is formed so as to overlap with the electrodes 716 to 722 and the oxide semiconductor film 715 with the insulating film having lower proportion of nitrogen provided between the insulating film having a barrier property, and the electrodes 716 to 722 and the oxide semiconductor film 715. By using the insulating film having a high barrier property, the impurities such as moisture or hydrogen can be prevented from entering the oxide semiconductor film 715, the gate insulating film 714, or the interface between the oxide semiconductor film 715 and another insulating film and the vicinity thereof. In addition, the insulating film having lower proportion of nitrogen, such as a silicon oxide film or a silicon oxynitride film, is formed so as to be in contact with the oxide semiconductor film 715, so that the insulating film having a high barrier property can be prevented from being in direct contact with the oxide semiconductor film 715.

In this embodiment, the insulating film 723 having a structure in which a silicon nitride film having a thickness of 100 nm formed by a sputtering method is stacked over a silicon oxide film having a thickness of 200 nm formed by a sputtering method is formed. The substrate temperature in film formation may be higher than or equal to room temperature and lower than or equal to 300° C. and in this embodiment, is 100° C.

After the insulating film 723 is formed, heat treatment may be performed. The heat treatment is performed under a nitrogen atmosphere, an oxygen atmosphere, an atmosphere of ultra-dry air (air in which the water content is less than or equal to 20 ppm, preferably less than or equal to 1 ppm, or more preferably less than or equal to 10 ppb), or a rare gas (e.g., argon and helium) atmosphere at preferably a temperature higher than or equal to 200° C. and lower than or equal to 400° C., for example, higher than or equal to 250° C. and lower than or equal to 350° C. In this embodiment, for example, heat treatment at 250° C. under a nitrogen atmosphere for 1 hour is performed. Alternatively, RTA treatment for a short time at a high temperature may be performed before the formation of the electrodes 716 to 722 in a manner similar to that of the previous heat treatment performed on the oxide semiconductor film. Even when oxygen deficiency occurs in the oxide semiconductor film 715 due to the heat treatment performed on the oxide semiconductor film, the insulating film 723 containing oxygen is provided in contact with an exposed region of the oxide semiconductor film 715 provided between the electrode 721 and the electrode 722, and then heat treatment is performed, whereby oxygen is supplied to the oxide semiconductor film 715. Therefore, when oxygen is supplied to the region of the oxide semiconductor film 715 which is in contact with the insulating film 723, oxygen deficiency serving as a donor can be reduced and the stoichiometric composition ratio can be satisfied. As a result, the oxide semiconductor film 715 can be made to be an i-type semiconductor film or a substantially i-type semiconductor film. Accordingly, electric characteristics of the transistor can be improved and variation in the electric characteristics thereof can be reduced. The timing of this heat treatment is not particularly limited as long as it is after the formation of the insulating film 723. When this heat treatment also serves as heat treatment in another step (e.g., heat treatment at the time of formation of a resin film or heat treatment for reducing the resistance of a transparent conductive film), the oxide semiconductor film 715 can be intrinsic or substantially intrinsic without an increase in the number of steps.

After a conductive film is formed over the insulating film 723, the conductive film is patterned, so that a back gate electrode may be formed in a position where the back gate electrode overlaps with the oxide semiconductor film 715. When the back gate electrode is formed, an insulating film is formed so as to cover the back gate electrode. The back gate electrode can be formed using a material and a structure similar to those of the gate electrode 713 or the electrodes 716 to 722.

The thickness of the back gate electrode is in the range of 10 nm to 400 nm, preferably 100 nm to 200 nm. For example, the back gate electrode may be formed in a such a manner that a conductive film in which a titanium film, an aluminum film, and a titanium film are stacked is formed, a resist mask is formed by a photolithography method or the like, and unnecessary portions are removed by etching so that the conductive film is processed (patterned) into a desired shape.

Through the above steps, a transistor 724 is formed.

The transistor 724 includes the gate electrode 713, the gate insulating film 714 over the gate electrode 713, the oxide semiconductor film 715 which is over the gate insulating film 714 and overlaps with the gate electrode 713, and a pair of the electrode 721 and the electrode 722 formed over the oxide semiconductor film 715. In addition, the transistor 724 may include the insulating film 723 formed over the oxide semiconductor film 715, as its component. The transistor 724 in FIG. 12D has a channel-etched structure in which part of the oxide semiconductor film 715 is etched between the electrode 721 and the electrode 722.

Although description is given using a single-gate transistor as the transistor 724, a multi-gate transistor including a plurality of channel formation regions by including a plurality of the gate electrodes 713 that are electrically connected to each other may be formed as needed.

This embodiment can be implemented in combination with any of the above embodiments.

Embodiment 7

In this embodiment, a transistor including an oxide semiconductor film having a structure different from that in Embodiment 6 will be described.

Figure 13A:
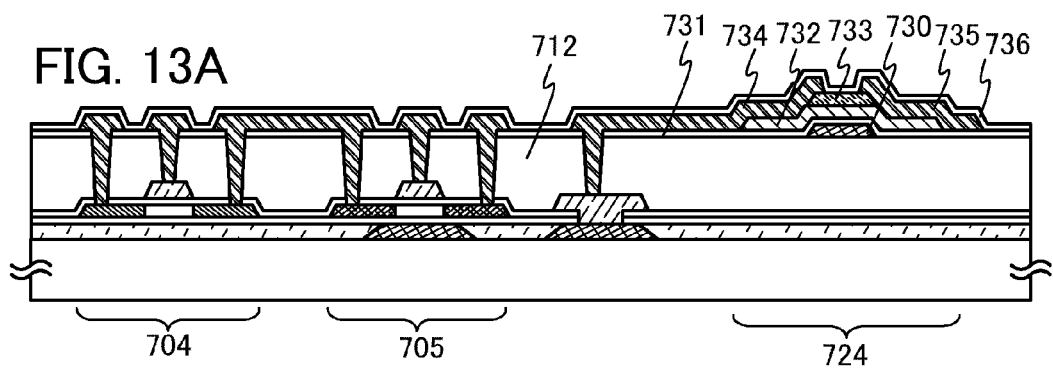
FIGS. 13A to 13C are cross-sectional views each showing an example of the structure of a semiconductor device.

In a manner similar to that of Embodiment 6, a logic circuit in FIG. 13A includes the n-channel transistor 704 and the p-channel transistor 705. In addition, a bottom-gate transistor 724 of a channel-protective structure, which includes an oxide semiconductor film, is formed over the n-channel transistor 704 and the p-channel transistor 705 in FIG. 13A.

The transistor 724 includes a gate electrode 730 formed over the insulating film 712, a gate insulating film 731 over the gate electrode 730, an island-shaped oxide semiconductor film 732 which is over the gate insulating film 731 and overlaps with the gate electrode 730, a channel protective film 733 which is formed over the oxide semiconductor film 732 in a position where the oxide semiconductor film 732 overlaps with the gate electrode 730, and an electrode 734 and an electrode 735 which are formed over the oxide semiconductor film 732. In addition, the transistor 724 may include an insulating film 736 formed over the oxide semiconductor film 732, as its component.

The channel protective film 733 can prevent a portion of the oxide semiconductor film 732, which serves as a channel formation region, from being damaged in a later step, for example, reduction in thickness due to plasma or an etchant in etching. Therefore, reliability of the transistor can be improved.

An inorganic material containing oxygen (silicon oxide, silicon nitride oxide, silicon oxynitride, aluminum oxide, aluminum oxynitride, or the like) can be used for the channel protective film 733. The channel protective film 733 can be formed by a vapor deposition method such as a plasma CVD method or a thermal CVD method, or a sputtering method. After the formation of the channel protective film 733, the shape thereof is processed by etching. Here, the channel protective film 733 is formed in such a manner that a silicon oxide film is formed by a sputtering method and processed by etching using a mask formed by photolithography.

An inorganic material containing oxygen is used for the channel protective film 733, whereby a structure can be provided, in which oxygen is supplied to a region of the oxide semiconductor film 732 in contact with at least the channel protective film 733 and oxygen deficiency serving as a donor is reduced to satisfy the stoichiometric composition ratio even when the oxygen deficiency occurs in the oxide semiconductor film 732 by heat treatment for reducing moisture or hydrogen. Thus, the channel formation region can be made to be i-type or substantially i-type and variation of electric characteristics of the transistor due to oxygen deficiency can be reduced; accordingly, the electric characteristics can be improved.

Note that the transistor 724 may further include a back gate electrode over the insulating film 736. The back gate electrode may be formed so as to overlap with a channel formation region of the oxide semiconductor film 732. Further, the back gate electrode may be electrically insulated and in a floating state, or may be in a state where the back gate electrode is supplied with a potential. In the latter case, the back gate electrode may be supplied with a potential having the same level as the gate electrode 730, or may be supplied with a fixed potential such as a ground potential. The level of the potential supplied to the back gate electrode is controlled, whereby the threshold voltage of the transistor 724 can be controlled.

Figure 13B:
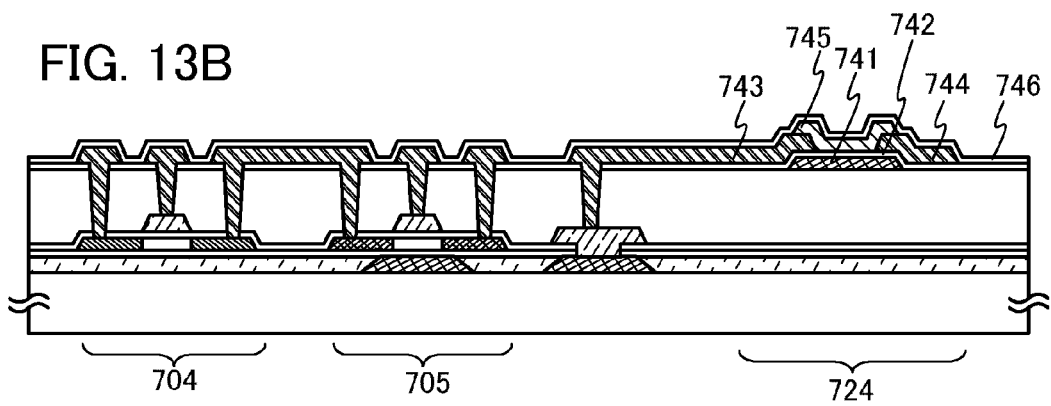

In a manner similar to that of Embodiment 6, a logic circuit in FIG. 13B includes an n-channel transistor 704 and a p-channel transistor 705 each including crystalline silicon. In addition, a bottom-contact transistor 724 which includes an oxide semiconductor film is formed over the n-channel transistor 704 and the p-channel transistor 705 in FIG. 13B.

The transistor 724 includes a gate electrode 741 formed over the insulating film 712, a gate insulating film 742 over the gate electrode 741, an electrode 743 and an electrode 744 over the gate insulating film 742, and an oxide semiconductor film 745 which overlaps with the gate electrode 741 with the gate insulating film 742 provided therebetween. In addition, the transistor 724 may include an insulating film 746 formed over the oxide semiconductor film 745, as its component.

Note that the transistor 724 may further include a back gate electrode over the insulating film 746. The back gate electrode may be formed so as to overlap with a channel formation region of the oxide semiconductor film 745. Further, the back gate electrode may be electrically insulated and in a floating state, or may be in a state where the back gate electrode is supplied with a potential. In the latter case, the back gate electrode may be supplied with a potential having the same level as the gate electrode 741, or may be supplied with a fixed potential such as a ground potential. The level of the potential supplied to the back gate electrode is controlled, whereby the threshold voltage of the transistor 724 can be controlled.

Figure 13C:
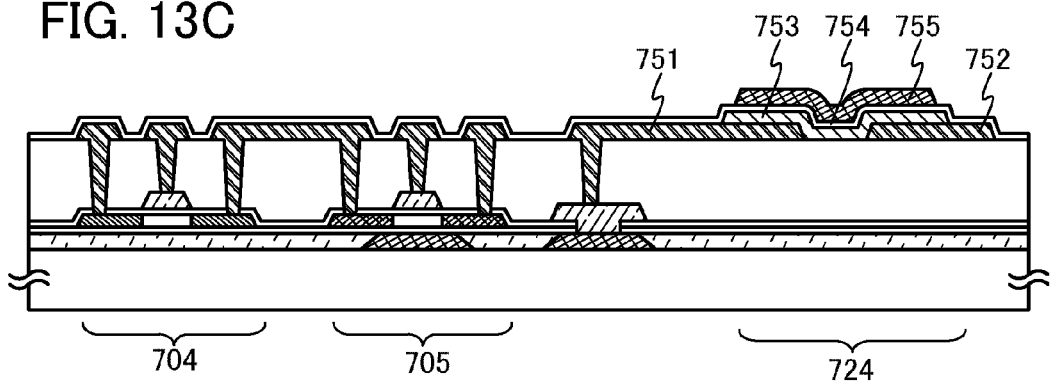

In a manner similar to that of Embodiment 6, a logic circuit in FIG. 13C includes an n-channel transistor 704 and a p-channel transistor 705 each including crystalline silicon. In addition, a top-gate transistor 724 which includes an oxide semiconductor film is formed over the n-channel transistor 704 and the p-channel transistor 705 in FIG. 13C.

The transistor 724 includes an electrode 751 and an electrode 752 formed over the insulating film 712, an oxide semiconductor film 753 formed over the electrode 751 and the electrode 752, a gate insulating film 754 over the oxide semiconductor film 753, and a gate electrode 755 which is over the gate insulating film 754 and overlaps with the oxide semiconductor film 753. In addition, the transistor 724 may include an insulating film formed over the gate electrode 755, as its component.

This embodiment can be implemented in combination with any of the above embodiments.

Embodiment 8

In a semiconductor device according to one embodiment of the present invention, a logic portion of a logic circuit may include a transistor manufactured using a bulk single crystal semiconductor substrate.

Figure 17:
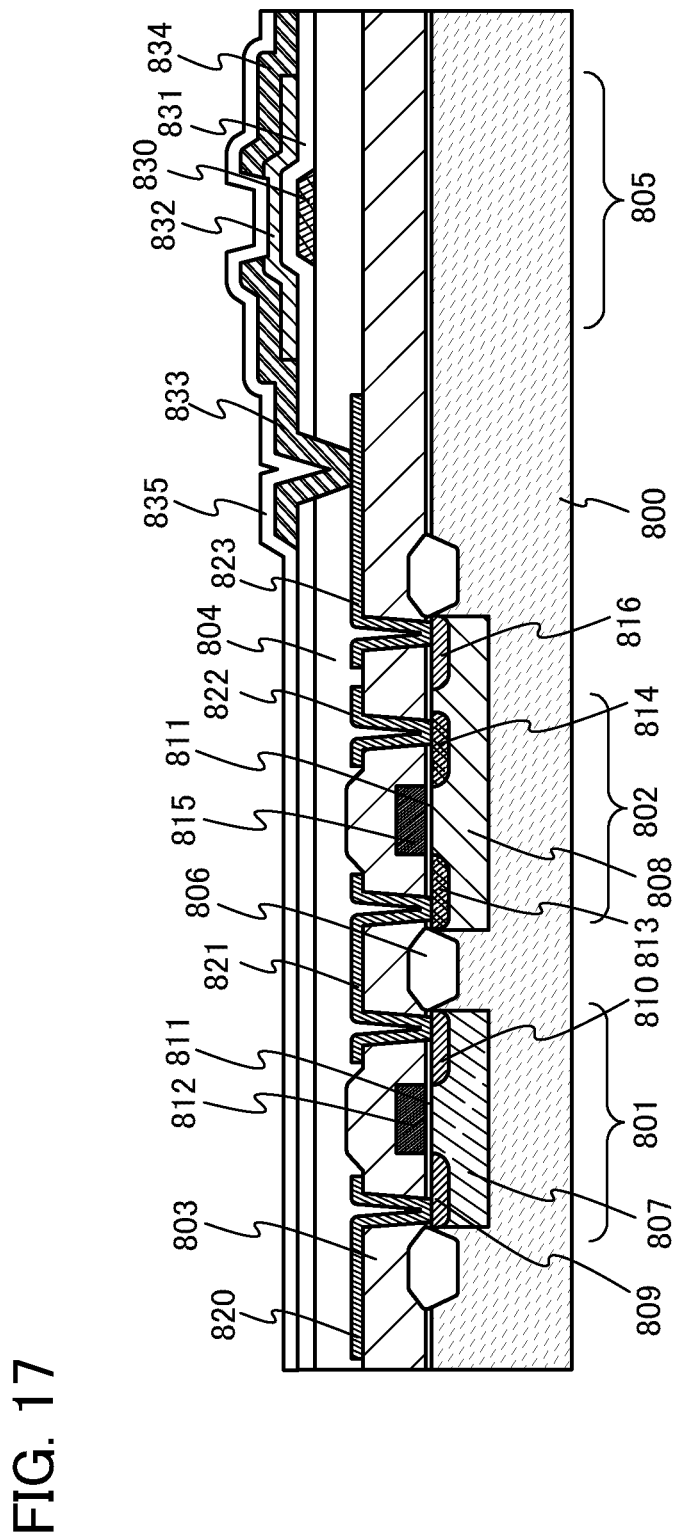
FIG. 17 is a cross-sectional view showing an example of the structure of a semiconductor device.

FIG. 17 shows a cross-sectional view of a logic circuit in which a transistor including an oxide semiconductor is formed over a transistor which is formed using the bulk single crystal semiconductor substrate, as an example.

The logic circuit in FIG. 17 includes an n-channel transistor 801 and a p-channel transistor 802 which are formed over a semiconductor substrate 800, and a transistor 805 which is formed over an insulating film 803 and an insulating film 804 which cover the n-channel transistor 801 and the p-channel transistor 802.

Although the case where the transistor 805 includes an oxide semiconductor in a channel formation region and, in FIG. 17, has the structure described in Embodiment 6 is shown as an example, the structure described in Embodiment 7 may be employed.

The semiconductor substrate 800 can be, for example, a single crystal silicon substrate having n-type or p-type conductivity, a compound semiconductor substrate (e.g., a GaAs substrate, an InP substrate, a GaN substrate, a SiC substrate, a sapphire substrate, or a ZnSe substrate), or the like. FIG. 17 shows, as an example, the case where a single crystal silicon substrate having p-type conductivity is used.

In addition, the n-channel transistor 801 and the p-channel transistor 802 are electrically isolated by an element isolation insulating film 806. For formation of the element isolation insulating film 806, a selective oxidation method (LOCOS (local oxidation of silicon) method), a trench isolation method, or the like can be used.

In the semiconductor substrate 800, in a region where the n-channel transistor 801 is formed, a region called a p-well 807 is formed by selectively introducing an impurity element imparting p-type conductivity, such as boron (B), aluminum (Al), or gallium (Ga). In addition, in the semiconductor substrate 800, in a region where the p-channel transistor 802 is formed, a region called an n-well 808 is formed by selectively introducing an impurity element imparting n-type conductivity, such as phosphorus (P) or arsenic (As).

Then, the n-channel transistor 801 includes an n-type impurity region 809 and an n-type impurity region 810 which are each selectively formed in the p-well 807 and function as a source region or a drain region, a gate insulating film 811 which covers the p-well 807, and a gate electrode 812 which overlaps with the p-well 807 with the gate insulating film 811 provided therebetween.

Further, the p-channel transistor 802 includes a p-type impurity region 813 and a p-type impurity region 814 which are each selectively formed in the n-well 808 and function as a source region or a drain region, the gate insulating film 811 which covers the n-well 808, and a gate electrode 815 which overlaps with the n-well 808 with the gate insulating film 811 provided therebetween.

Then, an n-type impurity region 816 is formed in the n-well 808.

The n-channel transistor 801 and the p-channel transistor 802 are covered with the insulating film 803. Then, an electrode 820, an electrode 821, an electrode 822, and an electrode 823 which each function as a source electrode or a drain electrode are formed over the insulating film 803. The electrode 820 is connected to the n-type impurity region 809 through a contact hole formed in the insulating film 803. The electrode 821 is connected to the n-type impurity region 810 and the p-type impurity region 813 through contact holes formed in the insulating film 803. The electrode 822 is connected to the p-type impurity region 814 through a contact hole formed in the insulating film 803. The electrode 823 is connected to the n-type impurity region 816 through a contact hole formed in the insulating film 803.

Further, in FIG. 17, the insulating film 804 is formed over the insulating film 803 so as to cover the electrodes 820 to 823.

The transistor 805 includes, over the insulating film 804, a gate electrode 830, an insulating film 831 over the gate electrode 830, an oxide semiconductor film 832 which overlaps with the gate electrode 830 with the insulating film 831 provided therebetween and functions as an active layer, and an electrode 833 and an electrode 834 in contact with the oxide semiconductor film 832. An insulating film 835 is formed over the oxide semiconductor film 832, the electrode 833, and the electrode 834 and may be included as a component of the transistor 805.

Further, the electrode 823 is connected to the electrode 833 through a contact hole formed in the insulating film 804.

In the logic circuit in FIG. 17, the potential of the n-well 808 where the p-channel transistor 802 is formed, that is, a substrate potential can be controlled by the potential supplied to the n-type impurity region 816. Then, the potential supplied to the n-type impurity region 816 can be held by the transistor 805.

This embodiment can be implemented in combination with any of the above embodiments.

Example 1

The semiconductor device according to one embodiment of the present invention is used, so that a highly reliable electronic device and an electronic device with low power consumption can be provided. In particular, in the case where a portable electronic device which has difficulty in continuously receiving power, an advantage in increasing the continuous duty period can be obtained when a semiconductor device with low power consumption according to one embodiment of the present invention is added as a component of the device.

The semiconductor device according to one embodiment of the present invention can be used for display devices, laptops, or image reproducing devices provided with recording media (typically, devices which reproduce the content of recording media and have displays for displaying the reproduced images such as digital versatile discs (DVDs)). Other than the above, as an electronic device which can use the semiconductor device according to one embodiment of the present invention, mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices are illustrated in FIGS. 16A to 16F.

Figure 16A:
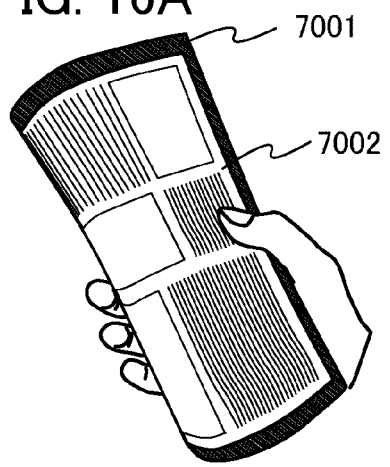
FIGS. 16A to 16F are diagrams each showing an example of an electronic device.

FIG. 16A is an e-book reader, which includes a housing 7001, a display portion 7002, and the like. The semiconductor device according to one embodiment of the present invention can be used for an integrated circuit for controlling driving of the e-book reader. With the use of the semiconductor device according to one embodiment of the present invention for the integrated circuit for controlling driving of the e-book reader, a highly reliable e-book reader and an e-book reader with low power consumption can be provided. Moreover, with the use of a flexible substrate, a semiconductor device can have flexibility. Thus, a flexible, lightweight, and useful e-book reader can be provided.

Figure 16B:
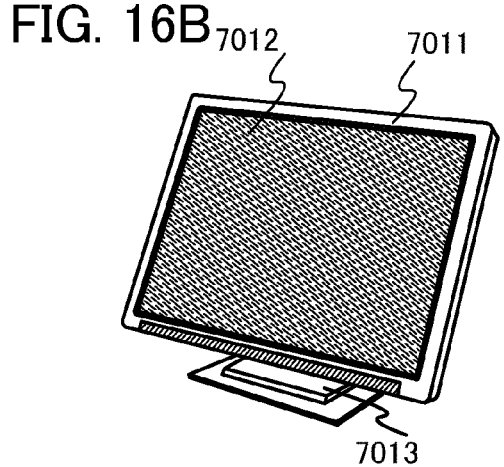

FIG. 16B is a display device, which includes a housing 7011, a display portion 7012, a supporting base 7013, and the like. The semiconductor device according to one embodiment of the present invention can be used for an integrated circuit for controlling driving of the display device. With the use of the semiconductor device according to one embodiment of the present invention for the integrated circuit for controlling driving of the display device, a highly reliable display device and a display device with low power consumption can be provided. Note that the display device includes all of information display devices for personal computers, TV receivers, advertisement displays, and the like.

Figure 16C:
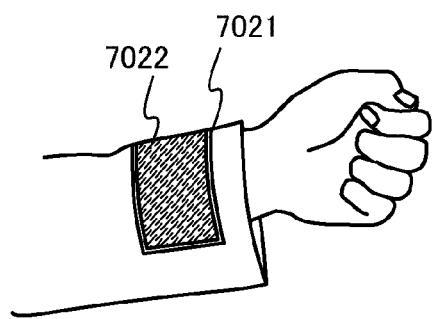

FIG. 16C is a display device, which includes a housing 7021, a display portion 7022, and the like. The semiconductor device according to one embodiment of the present invention can be used for an integrated circuit for controlling driving of the display device. With the use of the semiconductor device according to one embodiment of the present invention for the integrated circuit for controlling driving of the display device, a highly reliable display device and a display device with low power consumption can be provided. Moreover, with the use of a flexible substrate, a semiconductor device can have flexibility. Thus, a flexible, lightweight, and useful display device can be provided. Accordingly, as illustrated in FIG. 16C, the display device can be used while being fixed to fabric or the like, and an application range of the display device is dramatically widened.

Figure 16D:
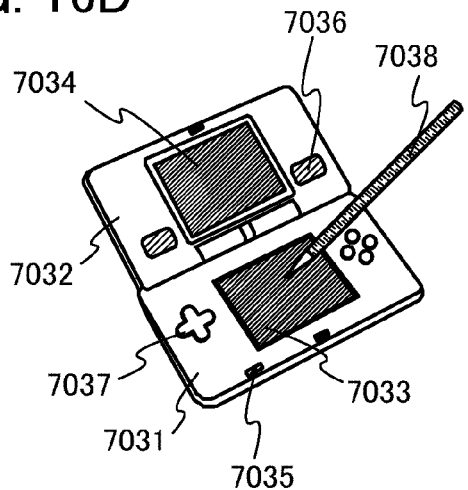

FIG. 16D is a portable game machine, which includes a housing 7031, a housing 7032, a display portion 7033, a display portion 7034, a microphone 7035, speakers 7036, an operation key 7037, a stylus 7038, and the like. The semiconductor device according to one embodiment of the present invention can be used for an integrated circuit for controlling driving of the portable game machine. With the use of the semiconductor device according to one embodiment of the present invention for the integrated circuit for controlling driving of the portable game machine, a highly reliable portable game machine and a portable game machine with low power consumption can be provided. Note that the portable game machine in FIG. 16D has the two display portions 7033 and 7034. However, the number of display portions included in the portable game machine is not limited thereto.

Figure 16E:
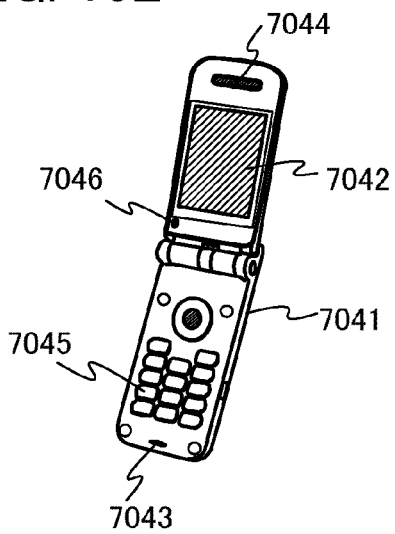

FIG. 16E is a mobile phone, which includes a housing 7041, a display portion 7042, an audio input portion 7043, an audio output portion 7044, operation keys 7045, a light receiving portion 7046, and the like. Light received in the light receiving portion 7046 is converted into electrical signals, whereby external images can be loaded. The semiconductor device according to one embodiment of the present invention can be used for an integrated circuit for controlling driving of the mobile phone. With the use of the semiconductor device according to one embodiment of the present invention for the integrated circuit for controlling driving of the mobile phone, a highly reliable mobile phone and a mobile phone with low power consumption can be provided.

Figure 16F:
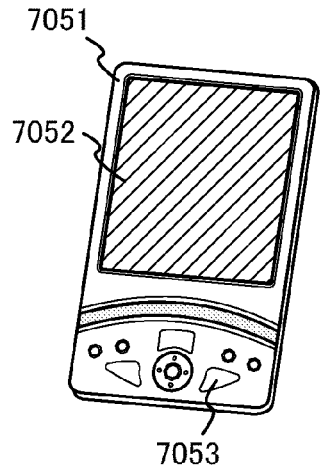

FIG. 16F is a portable information terminal, which includes a housing 7051, a display portion 7052, operation keys 7053, and the like. In the portable information terminal in FIG. 16F, a modem may be incorporated in the housing 7051. The semiconductor device according to one embodiment of the present invention can be used for an integrated circuit for controlling driving of the portable information terminal. With the use of the semiconductor device according to one embodiment of the present invention for the integrated circuit for controlling driving of the portable information terminal, a highly reliable portable information terminal and a portable information terminal with low power consumption can be provided.

This embodiment can be implemented in combination with any of the above embodiments.

What is claimed is:

1. A semiconductor device comprising:
a first transistor, the first transistor being an n-channel transistor, and a first gate of the first transistor being electrically connected to a first wiring to which a first signal is supplied;
a second transistor, the second transistor being a p-channel transistor, a first gate of the second transistor being electrically connected to a second wiring to which a second signal is supplied, and one of a source and a drain of the second transistor being electrically connected to one of a source and a drain of the first transistor;
an insulating film over the first transistor and the second transistor; and
a third transistor over the insulating film,
wherein one of the first transistor and the second transistor comprises a second gate,
wherein the second gate is electrically connected to one of a source and a drain of the third transistor, and
wherein a channel formation region of the third transistor comprises an oxide semiconductor layer.

2. The semiconductor device according to claim 1, wherein the oxide semiconductor layer comprises an In—Ga—Zn—O-based oxide semiconductor.

3. The semiconductor device according to claim 1, wherein a hydrogen concentration in the channel formation region of the third transistor is less than or equal to $5\times10^{19}$ atoms/cm$^3$.

4. The semiconductor device according to claim 1, wherein a value obtained by dividing an off-state current by a channel width of the third transistor is lower than or equal to 100 zA/μm.

5. The semiconductor device according to claim 1,
wherein the other of the source and the drain of the second transistor is electrically connected to a third wiring to which a first potential is supplied, and the other of the source and the drain of the first transistor is electrically connected to a fourth wiring to which a second potential is supplied, and wherein the first potential is higher than the second potential.

6. A semiconductor device comprising:
a first transistor, the first transistor being an n-channel transistor, and a first gate of the first transistor being electrically connected to a first wiring to which a first signal is supplied;
a second transistor, the second transistor being a p-channel transistor, a first gate of the second transistor being electrically connected to a second wiring to which a second signal is supplied, and one of a source and a drain of the second transistor being electrically connected to one of a source and a drain of the first transistor;
an insulating film over the first transistor and the second transistor; and
a third transistor over the insulating film,
wherein one of the first transistor and the second transistor comprises a second gate,
wherein the second gate is electrically connected to one of a source and a drain of the third transistor,
wherein a channel formation region of the third transistor comprises an oxide semiconductor layer, and
wherein a channel formation region of each of the first transistor and the second transistor comprises silicon.

7. The semiconductor device according to claim 6, wherein the oxide semiconductor layer comprises an In—Ga—Zn—O-based oxide semiconductor.

8. The semiconductor device according to claim 6, wherein a hydrogen concentration in the channel formation region of the third transistor is less than or equal to $5 \times 10^{19}$ atoms/cm$^3$.

9. The semiconductor device according to claim 6, wherein a value obtained by dividing an off-state current by a channel width of the third transistor is lower than or equal to 100 zA/µm.

10. The semiconductor device according to claim 6,
wherein the other of the source and the drain of the second transistor is electrically connected to a third wiring to which a first potential is supplied, and the other of the source and the drain of the first transistor is electrically connected to a fourth wiring to which a second potential is supplied, and
wherein the first potential is higher than the second potential.

11. A semiconductor device comprising:
a first transistor, the first transistor being an n-channel transistor, and a first gate of the first transistor being electrically connected to a first wiring to which a first signal is supplied;
a second transistor, the second transistor being a p-channel transistor, a first gate of the second transistor being electrically connected to a second wiring to which a second signal is supplied, and one of a source and a drain of the second transistor being electrically connected to one of a source and a drain of the first transistor;
an insulating film over the first transistor and the second transistor; and
a third transistor over the insulating film,
wherein a channel formation region of the third transistor comprises an oxide semiconductor layer, and
wherein a threshold voltage of one of the first transistor and the second transistor is controlled by setting a potential of a second gate included in the one of the first transistor and the second transistor or a substrate potential of the one of the first transistor and the second transistor.

12. The semiconductor device according to claim 1, wherein a logical value of the first signal is the same as a logical value of the second signal.

13. The semiconductor device according to claim 1, wherein a gate of the third transistor is electrically connected to a fifth wiring to which a third signal is supplied, and the other of the source and the drain of the third transistor is electrically connected to a sixth wiring to which a fourth signal is supplied.

14. The semiconductor device according to claim 6, wherein a logical value of the first signal is the same as a logical value of the second signal.

15. The semiconductor device according to claim 6, wherein a gate of the third transistor is electrically connected to a fifth wiring to which a third signal is supplied, and the other of the source and the drain of the third transistor is electrically connected to a sixth wiring to which a fourth signal is supplied.

16. The semiconductor device according to claim 6, wherein a band gap of the oxide semiconductor layer is wider than that of the silicon, and
wherein an intrinsic carrier density of the oxide semiconductor layer is lower than that of the silicon.

17. The semiconductor device according to claim 11, wherein a logical value of the first signal is the same as a logical value of the second signal.

18. The semiconductor device according to claim 11, wherein a gate of the third transistor is electrically connected to a fifth wiring to which a third signal is supplied, and the other of the source and the drain of the third transistor is electrically connected to a sixth wiring to which a fourth signal is supplied.

* * * * *